United States Patent
Jain et al.

(10) Patent No.: US 11,639,895 B2
(45) Date of Patent: May 2, 2023

(54) DEVICE INCLUDING OPTOFLUIDIC SENSOR WITH INTEGRATED PHOTODIODE

(71) Applicant: GLOBALFOUNDRIES U.S. Inc., Santa Clara, CA (US)

(72) Inventors: Vibhor Jain, Clifton Park, NY (US); Steven M. Shank, Jericho, VT (US); Anthony K. Stamper, Burlington, VT (US); John J. Ellis-Monaghan, Grand Isle, VT (US); John J. Pekarik, Underhill, VT (US); Yusheng Bian, Ballston Lake, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 114 days.

(21) Appl. No.: 17/195,887

(22) Filed: Mar. 9, 2021

(65) Prior Publication Data
US 2022/0291126 A1    Sep. 15, 2022

(51) Int. Cl.
| | |
|---|---|
| *G01N 21/64* | (2006.01) |
| *G01N 21/85* | (2006.01) |
| *H01L 31/0232* | (2014.01) |
| *H01L 31/12* | (2006.01) |
| *H01L 31/02* | (2006.01) |

(52) U.S. Cl.
CPC ......... *G01N 21/6402* (2013.01); *G01N 21/85* (2013.01); *H01L 31/02005* (2013.01); *H01L 31/02327* (2013.01); *H01L 31/12* (2013.01); *G01N 2201/06113* (2013.01)

(58) Field of Classification Search
CPC ............... G01N 21/6402; G01N 21/85; G01N 2201/06113; H01L 31/02005; H01L 31/02327; H01L 31/12
See application file for complete search history.

(56) References Cited

U.S. PATENT DOCUMENTS

| | | |
|---|---|---|
| 5,504,573 A | 4/1996 | Cheiky-Zelina |
| 6,438,279 B1 * | 8/2002 | Craighead ................ G02B 6/10 385/12 |
| 6,677,602 B1 | 1/2004 | Norton |
| (Continued) | | |

FOREIGN PATENT DOCUMENTS

CN          114113005 A     3/2022

OTHER PUBLICATIONS

Rahman at al., "On demand delivery and analysis of single molecules on a programmable nanopore-optofluidic device," Nature Communications, 10:3712, 2019.

(Continued)

*Primary Examiner* — Marcus H Taningco
(74) *Attorney, Agent, or Firm* — Anthony Canale; Hoffman Warnick LLC

(57) ABSTRACT

A "lab on a chip" includes an optofluidic sensor and components to analyze signals from the optofluidic sensor. The optofluidic sensor includes a substrate, a channel at least partially defined by a portion of a layer of first material on the substrate, input and output fluid reservoirs in fluid communication with the channel, at least a first radiation source coupled to the substrate adapted to generate radiation in a direction toward the channel, and at least one photodiode positioned adjacent and below the channel.

18 Claims, 23 Drawing Sheets

(56) References Cited

U.S. PATENT DOCUMENTS

| | | | |
|---|---|---|---|
| 7,248,771 B2 | 7/2007 | Schmidt et al. | |
| 7,483,140 B1* | 1/2009 | Cho | G01N 21/553 |
| | | | 356/448 |
| 8,994,946 B2 | 3/2015 | McCaffrey et al. | |
| 9,753,026 B1 | 9/2017 | Todd et al. | |
| 9,864,138 B2 | 1/2018 | Coolbaugh et al. | |
| 2003/0038248 A1 | 2/2003 | Maher et al. | |
| 2005/0189225 A1 | 9/2005 | Liu et al. | |
| 2006/0098927 A1 | 5/2006 | Schmidt et al. | |
| 2011/0236264 A1 | 9/2011 | Rajagopal et al. | |
| 2011/0262307 A1 | 10/2011 | Packirisamy et al. | |
| 2012/0058464 A1* | 3/2012 | Ermantraut | B01L 3/502723 |
| | | | 435/5 |
| 2012/0152006 A1 | 6/2012 | Aeppli et al. | |
| 2012/0188531 A1 | 7/2012 | Delville et al. | |
| 2013/0244227 A1 | 9/2013 | Schmidt et al. | |
| 2013/0307029 A1* | 11/2013 | Xu | G01N 27/4145 |
| | | | 257/253 |
| 2014/0273059 A1 | 9/2014 | Sharpe et al. | |
| 2015/0285998 A1* | 10/2015 | Babakhani | H01L 31/18 |
| | | | 438/27 |
| 2017/0350806 A1 | 12/2017 | Sinha et al. | |
| 2018/0015457 A1 | 1/2018 | McGuinness et al. | |
| 2018/0043687 A1* | 2/2018 | Govyadinov | G01N 21/27 |
| 2018/0045562 A1* | 2/2018 | Santori | G01J 3/0259 |
| 2018/0217122 A1 | 8/2018 | Meng et al. | |
| 2018/0284009 A1 | 10/2018 | Kaduchak et al. | |
| 2020/0018684 A1 | 1/2020 | Vercruysse | |
| 2021/0293703 A1* | 9/2021 | Shalabney | G01N 21/554 |

OTHER PUBLICATIONS

Reccius et al., "Conformation, Length, and Speed Measurements of Electrodynamically Stretched DNA in Nanochannels," Biphysical Journal, 95:273-286, Jul. 2008.

Schmidt et al., "Integrated ARROW waveguides for gas/liquid sensing," Proceedings of SPIE, Oct. 2004.

Non Final Office Action dated Feb. 18, 2022 for U.S. Appl. No. 17/006,050, filed Aug. 28, 2020; Pages 45.

Final Office Action dated May 26, 2022 for U.S. Appl. No. 17/006,050, filed Aug. 28, 2020; Pages 44.

Stott, Matthew A., et al.; Optimized ARROW-based MMI waveguides for high fidelity excitation patterns for optofluidic multiplexing; IEEE journal of quantum electronics 54.3; 2018; 1-7.

Hawkins, Aaron R., et al.; "Optofluidic waveguides: II. Fabrication and structures"; Microfluid Nanofluid; 2008; 4:17-32; 2008; <https://doi.org/10.1007/s10404-007-0194-z>.

* cited by examiner

DEVICE INCLUDING OPTOFLUIDIC SENSOR WITH INTEGRATED PHOTODIODE

FIELD OF THE DISCLOSURE

The present disclosure generally relates to various embodiments of a device including an optofluidic sensor with integrated photodiode and various methods of forming such a device.

BACKGROUND

Optofluidics is a technology area that generally involves the use of microfluidic technology and optics technology. There are various applications or products where optofluidic technology may be employed, e.g., displays, biosensors, lab-on-chip devices, lenses, and molecular imaging tools and energy. However, such optofluidic devices are typically very expensive to manufacture, involve complex methods to package together discrete devices, and result in relatively large devices that are not readily scaled.

SUMMARY

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

The present disclosure is directed to various embodiments of a device including an optofluidic sensor with integrated photodiode and various methods of forming such a device. One illustrative device disclosed herein can include a substrate, a channel formed on an upper surface an upper surface of a layer of a first material formed on the substrate and that is adapted to receive fluid therein, the channel being at least partially defined by at least a portion of the top surface of the layer of first material formed on the substrate, walls of the channel being formed from a second material that is dielectric material. The device can also include an input fluid reservoir and an output fluid reservoir, wherein the channel is in fluid communication with the input fluid reservoir and the output fluid reservoir. In this example, the device can further include a first radiation source operatively coupled to the substrate, wherein the first radiation source is adapted to generate radiation in a first direction toward the channel, and at least one first photodiode positioned below the channel.

In another example, the device can include a substrate, a channel adapted to receive a fluid therein, the channel being at least partially defined by at least an upper surface an upper surface of a layer of first material formed on the substrate, and the channel having a long axis and first and second opposing sides, walls of the channel being formed from a second material that is a dielectric material. The device can also include an input fluid reservoir and an output fluid reservoir, and the channel can be in fluid communication with and arranged to convey fluid from the input fluid reservoir to the output fluid reservoir. A first radiation source can be operatively coupled to the substrate, wherein the first radiation source can be adapted to generate radiation in a direction that is substantially normal to the long axis of the channel. The device can have at least one waveguide structure extending from the first radiation source to the first side of the channel, wherein the at least one waveguide structure is formed from the second material and extending from the first radiation source to the first side of the channel. The at least one waveguide structure can be adapted to transmit radiation from the first radiation source to the first side of the channel. At least one first photodiode can be positioned adjacent and vertically below the second side of the channel, and the at least one waveguide structure can further extend from the second side of the channel to the at least one first photodiode. A transverse exposure portion of the channel can be at least partially defined by an extent of the at least one waveguide structure along the long axis of the channel. In the transverse exposure portion, during operation, radiation from the first radiation source can pass from the first side of the channel, through the channel, and out the second side of the channel.

In a third example, the device can comprise an optofluidic sensor system including a substrate having a layer of first material formed thereon, an input fluid reservoir, an output fluid reservoir, and a channel formed on an upper surface an upper surface of the layer of first material. The channel can be in fluid communication with the input fluid reservoir and the output fluid reservoir, and the walls of the channel can be formed from a second material that is a dielectric material. The optofluidic sensor system can further include at least one radiation source operatively coupled to the substrate such that the at least one radiation source is in photonic communication with the channel. At least one photodiode can be positioned below the channel such that the at least one photodiode will receive radiation from the at least one radiation source that passes through the channel. The device can further include a processing system formed on the substrate and in electrical communication with the optofluidic sensor system. The processing system can include at least one component in electrical communication with, and responsive to, a change in an electrical parameter of the at least one photodiode.

BRIEF DESCRIPTION OF THE DRAWINGS

The disclosure may be understood by reference to the following description taken in conjunction with the accompanying drawings, in which like reference numerals identify like elements, and in which.

Figure 1:
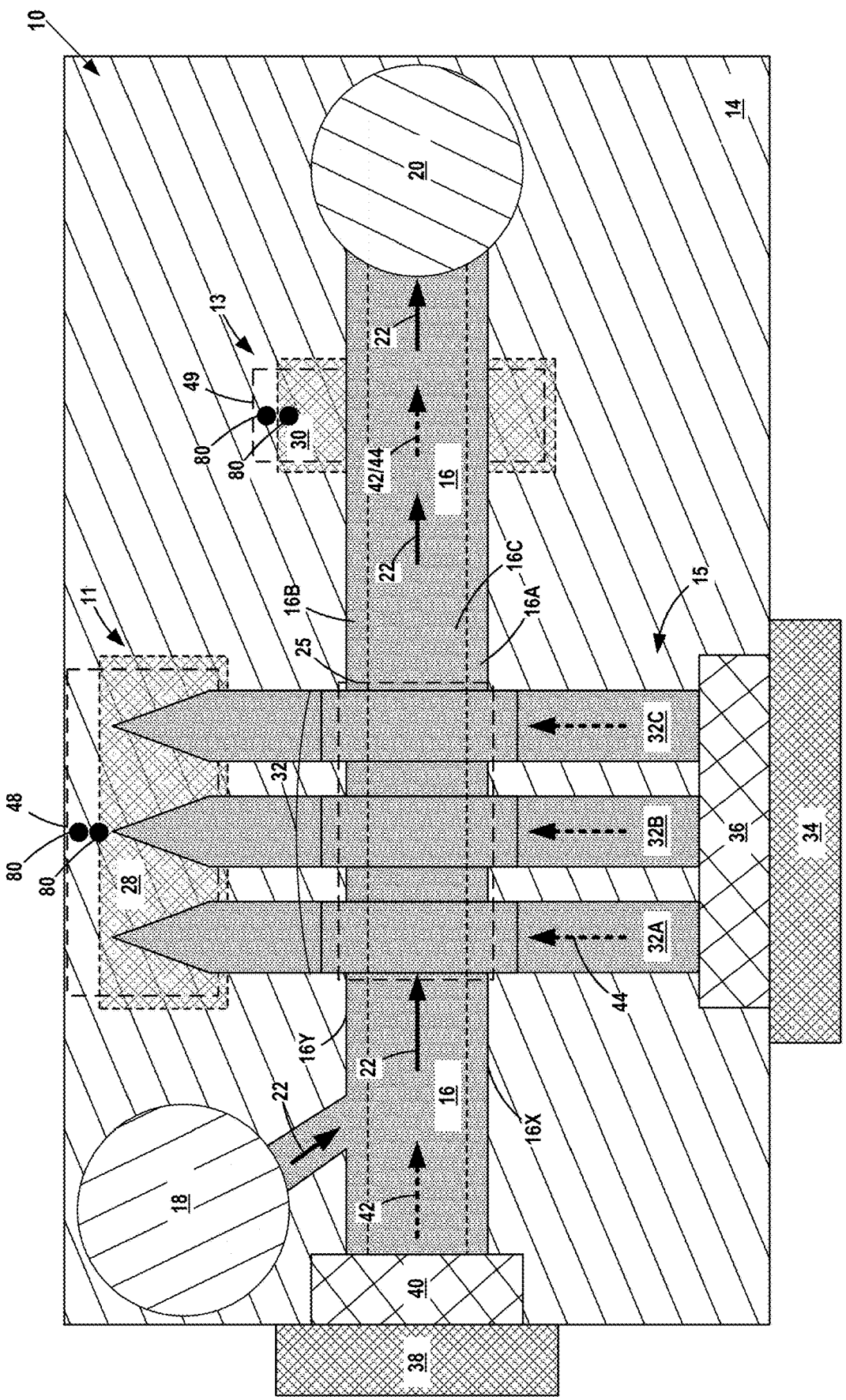
FIGS. 1-23 depict various embodiments of an optofluidic sensor with integrated photodiode and various methods of forming such a device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

In this description, "insulative material" can include any suitable insulative material can be used, which can include any suitable dielectric material. Further, "dielectric material" can include, but is not limited to any interlevel or intralevel dielectric material including inorganic dielectric materials, organic dielectric materials, or combinations thereof. Suitable dielectric materials can include, but are not limited to: silicon dioxide materials, including carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectricals, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIGS. 1-23 depict various embodiments of a device 10 including an optofluidic sensor with integrated photodiode and various methods of forming such a device 10. In embodiments, device 10 can include a processing system formed on the substrate and in electrical communication with the optofluidic sensor. FIG. 1 is a simplistic plan view and a partial sectional view of one illustrative embodiment of device 10. Device 10 can be fabricated in and above a semiconductor substrate 12 (see FIG. 3). With reference to FIG. 1, in one illustrative embodiment, device 10 can generally include a first photodiode array 11, a second photodiode array 13, a waveguide structure such as a waveguide array 15, a channel 16, an input fluid reservoir 18, an output fluid reservoir 20, a first radiation source 34 adapted to generate first radiation 44 in a first direction toward channel 16, and a second radiation source 38 adapted to generate second radiation 42 in a second direction toward channel 16. In embodiments, and as shown in FIG. 1, one or both of first and second photodiode arrays 11, 13 can include one or more respective photodiodes 28, 30 that are "buried" in material below a surface on which channel 16 is formed. As depicted in FIG. 1, channel 16 can have a longitudinal axis extending from a first end closest to second radiation source 40 to a second, opposed end closest to output reservoir 20, substantially co-linear with a centerline 16L (see FIG. 2) of channel 16. In embodiments, first radiation 34 can be positioned to emit first radiation 44 perpendicular to centerline 16L, while second radiation source 38 can be positioned to emit second radiation 42 in a direction parallel to and/or along centerline 16L. Channel 16 can be in fluid communication with input fluid reservoir 18 and output fluid reservoir 20, and channel 16 can be adapted to receive fluid 22 therein. A transverse exposure portion 25 of channel 16 can be at least partially defined by an extent of waveguide array 15 along the long axis of channel 16. As will be appreciated by those skilled in the art after a complete reading of the present application, the optofluidic sensor with integrated photodiode disclosed herein can be used to analyze samples, e.g., DNA, RNA, virus, proteins, etc. (not shown), that may be present in fluid 22 as the samples flow through channel 16 of device 10.

In one illustrative example, device 10 can be used to measure a photon count of a fluorescence signal of a sample as excited by one or both of radiation sources 34, 38, and compare that measured value to a reference value. Typically, during the process of analyzing the samples, fluid 22 can be held in an approximate steady state condition and samples contained within fluid 22 (DNA, RNA, virus, proteins, etc.) can be moved from input fluid reservoir 18 to output fluid reservoir 20 using electrostatic forces by mechanisms that are known to those skilled in the art. Electrical contacts can be made through input fluid reservoir 18 and output fluid reservoir 20. As the samples pass through transverse exposure portion 25 of channel 16, the samples can interact with radiation from first radiation source 34 entering channel 16 from waveguides 32A-C, collectively referred to as waveguides 32, also referred to as waveguide structures. First radiation 44 can enter channel 16 after being conveyed from first radiation source 34, through first coupler 36, through a first portion of waveguides 32, and through a first wall 16A on first side 16X of channel 16. After passing through channel 16, first radiation 42 and any fluorescence signal can exit through a second wall 16B at second side 16Y of channel 16 and can then be carried to first photodiode array 11 by a remainder of waveguides 32. Channel 16 also includes an upper wall 16C. The passage of first radiation 44 through channel 16 is achieved with lower losses than in prior art optofluidic sensors since waveguides 32 and walls 16A, 16B, 16C of channel 16 are formed from the same materials, as will be described in more detail below. For the same reason, any fluorescent radiation produced by samples in fluid 22 and entering waveguides 32 will experience lower losses as it travels to first photodiode array 11 than prior art optofluidic sensors.

In the depicted example, first photodiode array 11 can include at least one illustrative doped first photodiode 28, e.g., one or more PIN diodes, formed below a surface of a layer of material on which channel 16 or waveguides 32 can be formed. Of course, as will be appreciated by those skilled in the art after a complete reading of the present application, first photodiode array 11 can comprise any number of first photodiodes 28. In some cases, first photodiode array 11 can be omitted entirely and the device can comprise only second photodiode array 13. First photodiode 28 can be of any physical size or configuration, and where more than one photodiode is present, the size and configuration of each first photodiode 28 need not be the same, but that may be the case in some applications. First photodiodes 28 can include a variety of different materials, e.g., a doped semiconductor material, such as germanium, silicon, silicon-germanium, germanium-tin, a III-V material, etc. The techniques of forming such first photodiodes 28 are well known to those skilled in the art. In the particular example depicted herein, first photodiode 28 can have a substantially rectangular configuration, wherein, when viewed from above, a long axis of first photodiode 28 (extending from left to right in FIG. 1) is oriented substantially parallel to centerline 16L (see FIG. 2) of channel 16. Of course, first photodiode 28 could have a substantially square configuration when viewed from above, wherein one axis of first photodiode 28 is oriented substantially parallel to centerline 16L. As will be appreciated by those skilled in the art after a complete reading of the present application, in this particular example of device 10, photodiode 28 can be adapted for sensing orthogonal fluorescence of samples in fluid 22 flowing through channel 16 when irradiated by first and/or second radiation sources 34, 38. To reduce losses due to unwanted evanescent or adiabatic coupling, any photonic component should be isolated 2-3 µm from a silicon or germanium component, such as substrate 12 when it includes silicon or germanium. Also depicted in FIG. 1 is a first conductive structure 48 (e.g., a metal line, a metal silicide) that can be conductively coupled to first photodiode 28. Simplistically depicted conductive contacts 80 can be conductively coupled to first conductive structure 48. Other conductive contacts 80 can be conductively coupled to portions of the active layer of semiconductor substrate 12, as described more fully below.

In the depicted example, second photodiode array 13 can include at least one illustrative doped second photodiode 30 formed below a surface of a layer of material on which channel 16 and/or waveguides 32 can be formed. Of course, as will be appreciated by those skilled in the art after a complete reading of the present application, second photodiode array 13 can comprise any number of second photodiodes 30, and, in some cases, second photodiode array 13 can comprise only a single second photodiode 30. However, in some applications, second photodiode array 13 can be omitted entirely. Second photodiode 30 can be of any physical size or configuration, and, when more than one second photodiode 30 is present, the size and configuration of each second photodiode 30 need not be the same, but that may be the case in some applications. Second photodiode 30 can be comprised of a variety of different materials, e.g., a doped semiconductor material, such as germanium, silicon, silicon-germanium, germanium-tin, a III-V material, etc. The techniques of forming such second photodiodes 30 are well known to those skilled in the art. In the particular example, second photodiode 30 can have a substantially rectangular configuration, wherein, when viewed from above, a long axis of second photodiode 30 (extending from top to bottom in FIGS. 1 and 2) can be oriented substantially perpendicular to centerline 16L (see FIG. 2) of channel 16. Of course, second photodiode 30 could have a substantially square configuration when viewed from above, wherein one axis of second photodiode 30 can be oriented substantially perpendicular to centerline 16L. As will be appreciated by those skilled in the art after a complete reading of the present application, second photodiode 30 can be adapted for sensing fluorescence due to laser excitation parallel to the flow of samples in fluid 22 flowing through channel 16. In an example of second photodiode array 13 depicted in the Figures, second photodiode array 13 includes one second photodiode 30 positioned under and across channel 16. In this particular example, second photodiode 30 is positioned downstream from waveguide array 15 (in terms of the direction of flow of the samples in fluid 22), but that need not be the case in all applications. Moreover, in some applications, one of first photodiode array 11 or second photodiode array 13 may be omitted entirely. For example, in one particular embodiment, first photodiode array 11 may be omitted and second photodiode array 13 may be positioned vertically below waveguide array 15. As noted above, to reduce losses due to unwanted evanescent or adiabatic coupling, any photonic component should be isolated at least 2-3 µm away from a silicon or germanium component, such as substrate 12 when it includes silicon or germanium. In addition, to reduce error, embodiments can have second photodiode array 13 separated from first photodiode array 11 by at least 2-3 µm. Also depicted in FIG. 1 is a second conductive structure 49 (e.g., a metal line, a metal silicide) that can be conductively coupled to photodiode 30. Simplistically depicted conductive photodiode electrical contacts 80 can be conductively coupled to conductive structure 49.

In the depicted example, waveguide array 15 can comprise three illustrative waveguide structures 32A-C (generally referenced using the numeral 32). Of course, as will be appreciated by those skilled in the art after a complete reading of the present application, device 10 can comprise any number of waveguide structures 32, and, in some cases, device 10 may comprise only a single waveguide structure 32. Each of waveguide structures 32 is adapted to transmit radiation generated by first radiation source 34 toward channel 16. Each of waveguide structures 32 can be positioned between first radiation source 34 and a first side 16X of the channel 16. Waveguide structures 32 can be constructed to support guided modes of a particular wavelength. Waveguide dimensions can be correlated to the wavelength of the laser excitation and the index of refraction of the waveguide core. Waveguide structure(s) 32 may be of any physical size or configuration, and the size and configuration of waveguide structures 32 need not be the same, but that may be the case in some applications. Waveguide structures 32 may be comprised of a variety of different materials, e.g., a semiconductor material, such as silicon, silicon nitride, etc. The techniques of forming such waveguide structures 32 are well known to those skilled in the art. In the particular example depicted herein, waveguide structures 32 can have a substantially rectangular configuration, wherein, when viewed from above, the long axis of each waveguide structure 32 (extending from top to bottom in FIG. 1) is oriented substantially normal to centerline 16L (see FIG. 2) of channel 16. Of course, any of waveguide structures 32 could have a substantially square configuration when viewed from above, wherein one axis of such a waveguide structure 32 is oriented substantially normal to centerline 16L. As will be appreciated by those skilled in the art after a complete reading of the present application, waveguide structures 32 are adapted to guide and/or direct first radiation 44 generated by first radiation source 34 toward channel 16 and samples in fluid 22 therein.

First and second radiation sources 34, 38 may take a variety of forms. In one illustrative example, first and second radiation sources 34, 38 may comprise optical fibers carrying radiation from one or more radiation generating devices, such as one or more lasers. In embodiments where one or both of first and second radiation sources 34, 38 include optical fibers, any of a variety of different simplistically depicted attachment mechanisms 36, 40, respectively, can be used to couple such optical fibers to device 10, e.g., trenches in which the optical fibers can be positioned and bonded. First and second radiation sources 34, 38 can be adapted to generate radiation at any desired wavelength. In one illustrative embodiment, first and second radiation sources 34, 38 can be adapted to generate radiation at wavelengths that fall within the range of 0.4-3.0 µm. In one illustrative embodiment, first radiation source 34 can be adapted to generate first radiation 44 in a direction that is substantially normal to centerline 16L of channel 16 (e.g., substantially normal to the direction of the flow of fluid 22) and thereby cause any irradiated samples to fluoresce. In one illustrative embodiment, second radiation source 38 can be adapted to generate second radiation 42 in a direction that is substantially parallel to centerline 16L of channel 16 (e.g., substantially parallel to a direction of the flow of fluid 22) and thereby cause any irradiated samples to fluoresce. In the particular example depicted herein, first radiation source 34 can be positioned on first side 16X of channel 16, while photodiode 28 can be positioned adjacent a second, opposite side 16Y of channel 16.

The energy required to cause the movement of fluid 22 and any samples therein from input fluid reservoir 18 to output fluid reservoir 20 may be provided by a variety of known systems and techniques, e.g., known pumping systems, known systems that employ capillary forces as the motive force for fluid 22, known systems employing known electrophoretic forces, etc. The physical size of input fluid reservoir 18 and output fluid reservoir 20 may vary depending upon the particular application. Fluid 22 may be any suitable type of liquid, e.g., buffer, pH buffer, Tris buffer, Tris EDTA (ethylenediaminetetraacetic acid) buffer, etc. As noted above, in one illustrative embodiment, fluid 22 may contain samples, which can include biological materials, e.g., DNA, a virus, proteins, etc. In other applications, fluid 22 may be substantially free of any particles or materials.

In the depicted example of device 10, at least one waveguide structure 32 can be positioned between first radiation source 34 and first photodiode 28. Waveguide structure(s) 32 can extend from first radiation source 34 to first side 16X of channel 16, up first side 16X along first wall 16A, along an upper surface 16T of channel 16 (FIG. 23), which is also an upper surface of upper wall 16C, down second side 16Y along second wall 16B of channel 16, and from second side 16Y of channel 16 to and over first photodiode(s) 28.

Figure 2:
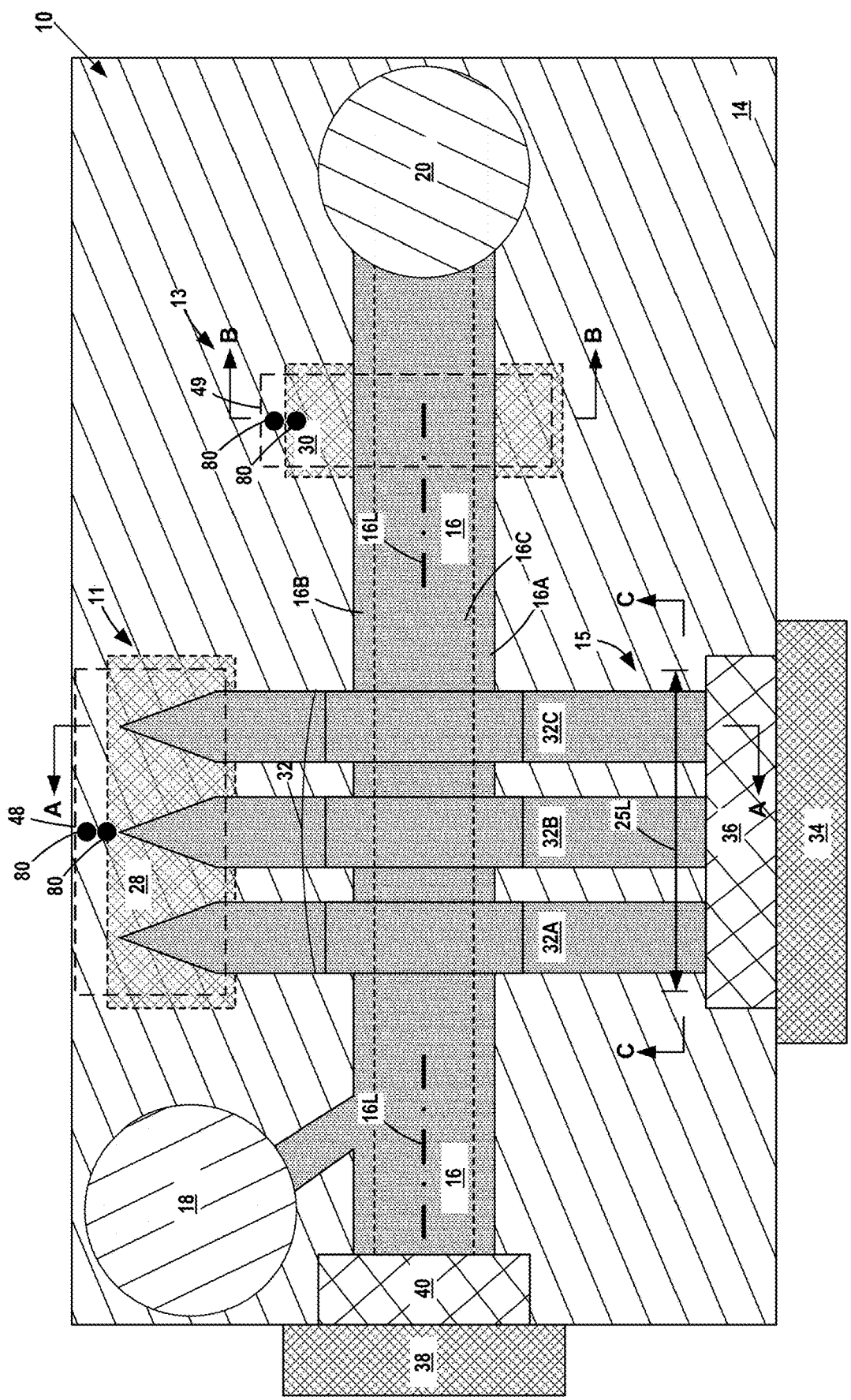
Figure 23:
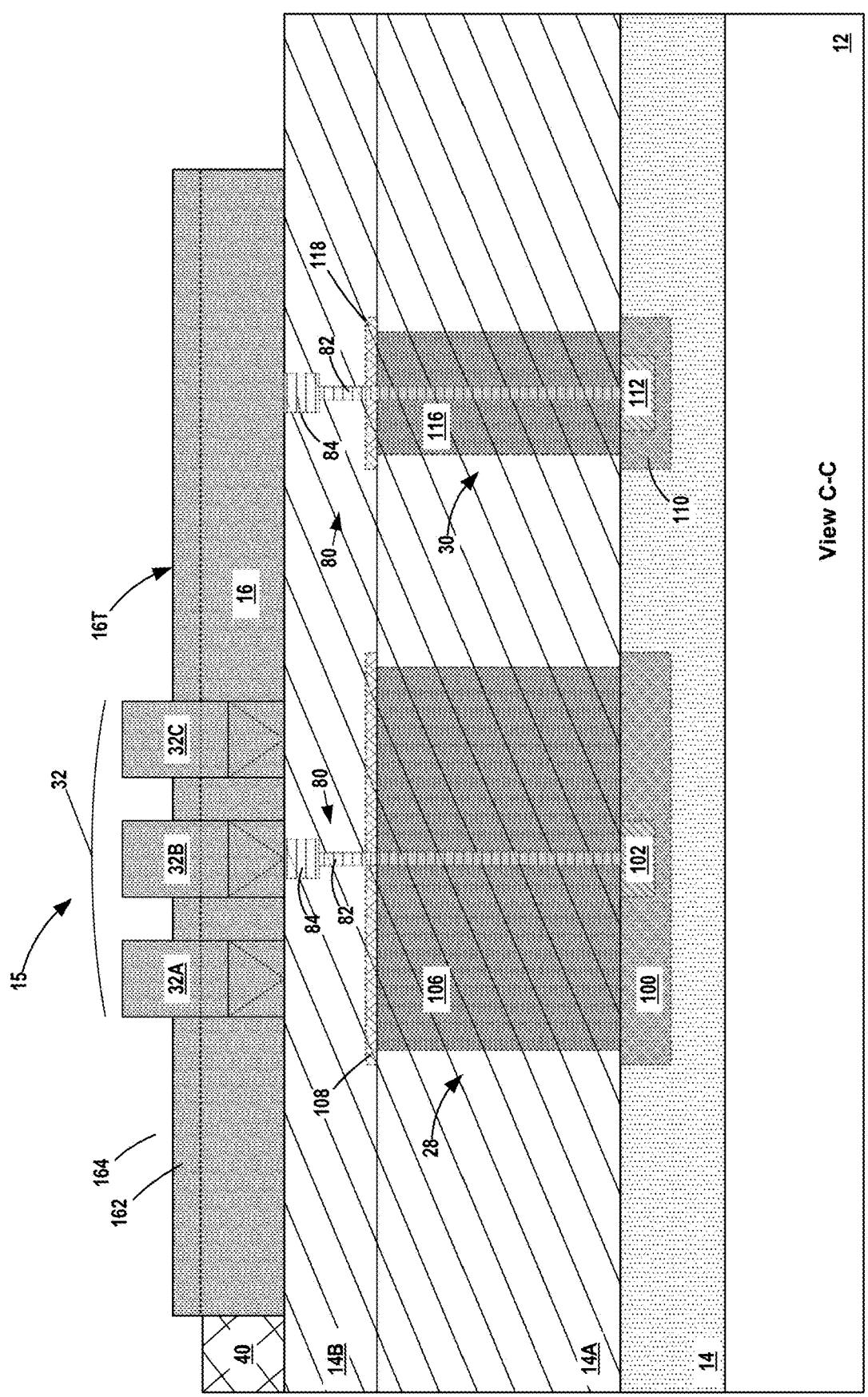

FIG. 2 is a copy of FIG. 1 with some of the reference numbers and fluid flow arrows omitted. The purpose of FIG. 2 is to show where various cross-sectional views shown in the attached drawings are shown. View A-A is taken through first photodiode 28, channel 16, and waveguide 32C looking upstream or toward input fluid reservoir 18. The view A-A is shown in FIGS. 3, 4, 6, 8, 10, 12, 15, 18, and 21. View B-B is taken through second photodiode 30 and channel 16 looking downstream or toward output fluid reservoir 20. View B-B is shown in FIGS. 5, 7, 9, 11, 13, 16, 19, and 22. View C-C is taken through waveguide structures 32 looking toward channel 16 and first photodiode 28. The view C-C is shown in FIG. 23. Some of the materials shown in the attached cross-sectional views are not depicted in FIG. 1 or 2 so as to not overly complicate the drawings.

Figure 3:
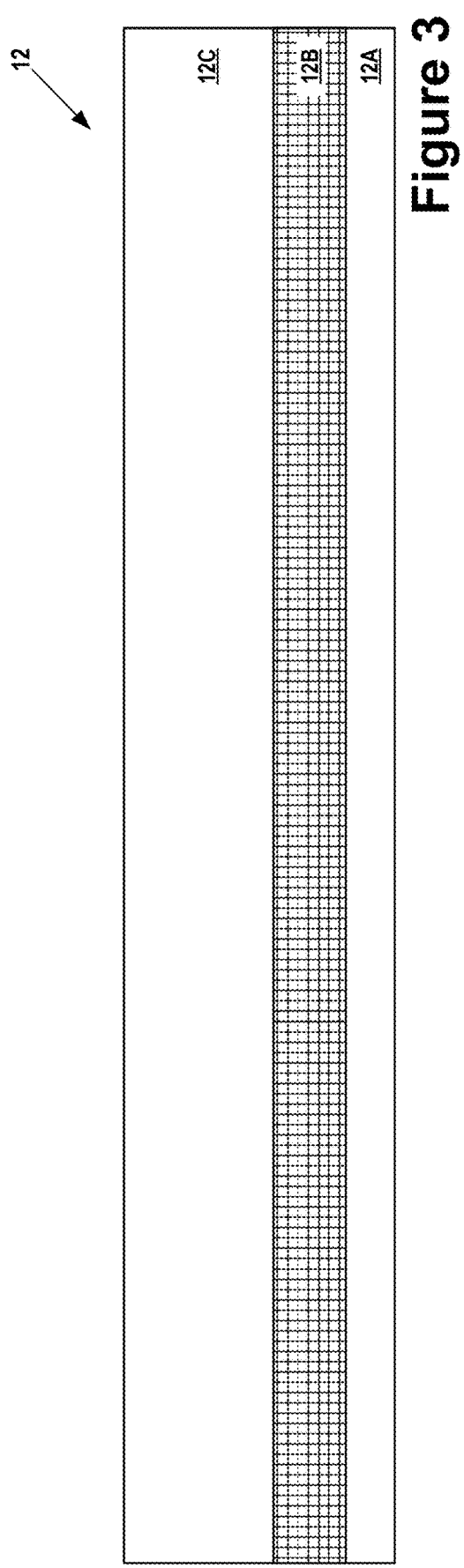

With reference to FIG. 3, in the depicted example, device 10 can be formed above a semiconductor substrate 12. Advantageously, embodiments of device 10 can be formed using back end of line (BEOL) processes, so that substrate 12 can include or be one or more devices formed using front end of line (FEOL) processes, middle of line (MOL) processes, and/or BEOL processes, though substrate 12 can also be a bulk semiconductor wafer or can take other forms. For example, as illustrated in FIG. 3, substrate 12 can take the form of a semiconductor-on-insulator (SOI) including a base semiconductor layer 12A, a buried insulation layer 12B positioned on base semiconductor layer 12A, and an active semiconductor layer 12C positioned above buried insulation layer 12B, wherein device 10 can be formed in and above active semiconductor layer 12C. The thickness of active semiconductor layer 12C and buried insulation layer 12B may vary depending upon the particular application, and it should be understood that the drawings depicted herein are not to scale. Typically, base semiconductor layer 12A will be thicker than active semiconductor layer 12C. In one illustrative embodiment, active semiconductor layer 12C may be substantially free of any appreciable amount of dopant material, i.e., active semiconductor layer 12C may be an intrinsic semiconductor material. Where substrate 12 is SOI, active semiconductor layer 12C and base semiconductor layer 12A need not be made of the same semiconductor material, but that may be the case in some applications. In some applications, active semiconductor layer 12C and base semiconductor layer 12A, or all of substrate 12, may be made of silicon or they may be made of semiconductor materials other than silicon. Thus, the terms "substrate" or "semiconductor substrate" should be understood to cover all semiconductor materials and all forms of such materials. Where substrate 12 is SOI, buried insulation layer 12B may comprise any desired insulating material, e.g., silicon dioxide, silicon nitride, etc. As used herein and in the claims, the terms "substrate" or "semiconductor substrate" should also be understood to mean the substrate as a whole. For example, in the case where device 10 is formed on an SOI substrate, if it is stated that, for example, a flow path is at least partially defined in the substrate, it means the flow path can be at least partially defined by active semiconductor layer 12C alone, buried insulation layer 12B alone, or by base semiconductor layer 12A alone, or by any combination of active layer 12C, buried insulation layer 12B, and base semiconductor layer 12A. To the extent that it is necessary to distinguish between active semiconductor layer 12C, buried insulation layer 12B, or base semiconductor layer 12A of an SOI substrate, those terms will be specifically used. For the remainder of the description and Figures herein, device 10 disclosed herein will be described and shown as manufactured on a bulk semiconductor substrate, such as a traditional bulk silicon substrate.

Figure 4:
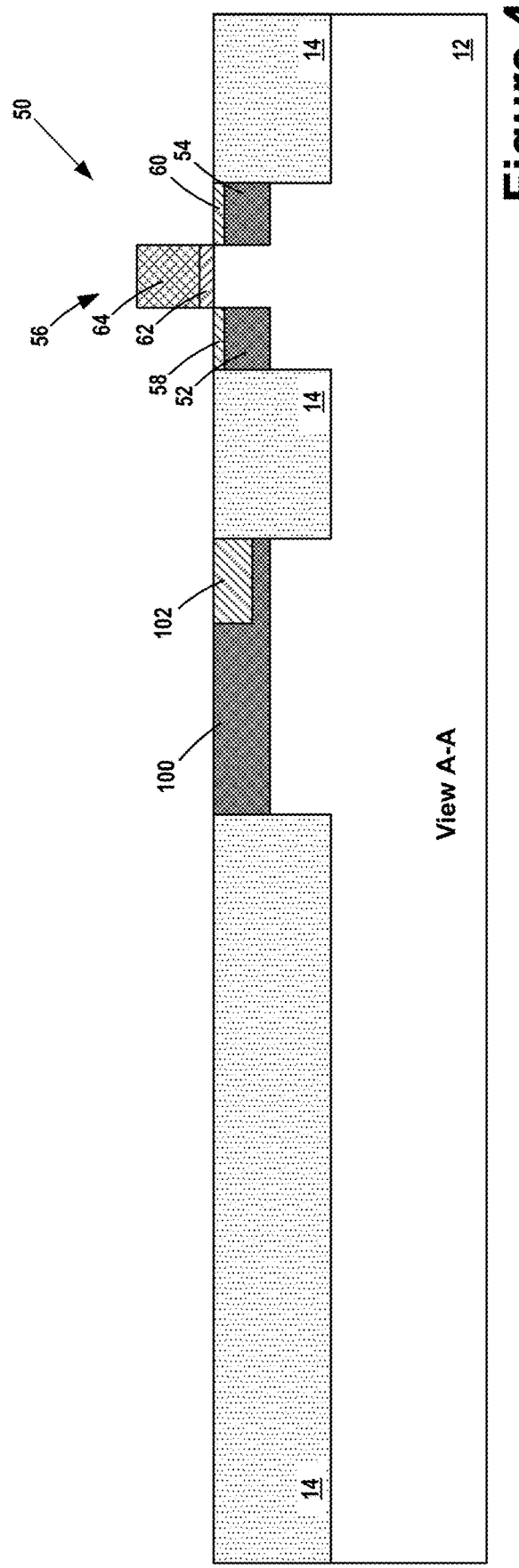
Figure 5:
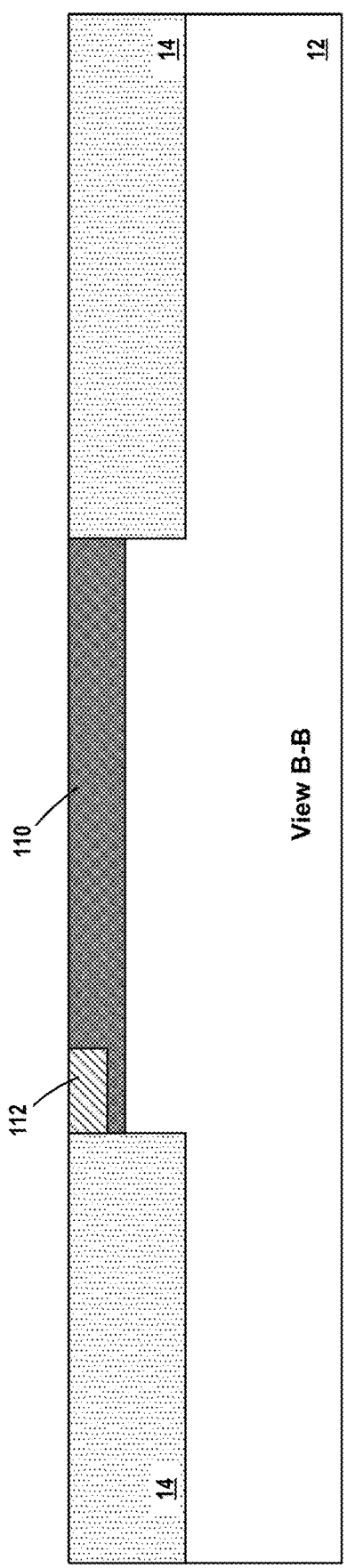
Figure 8:
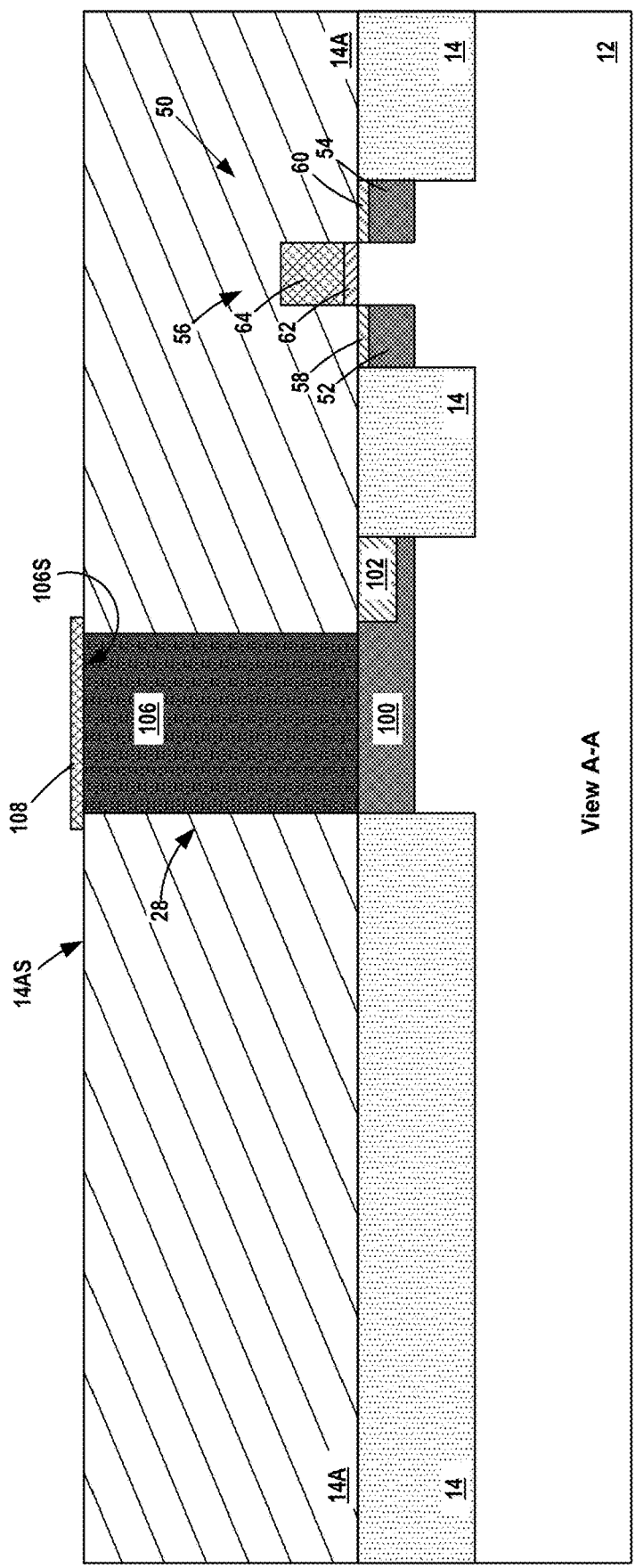
Figure 9:
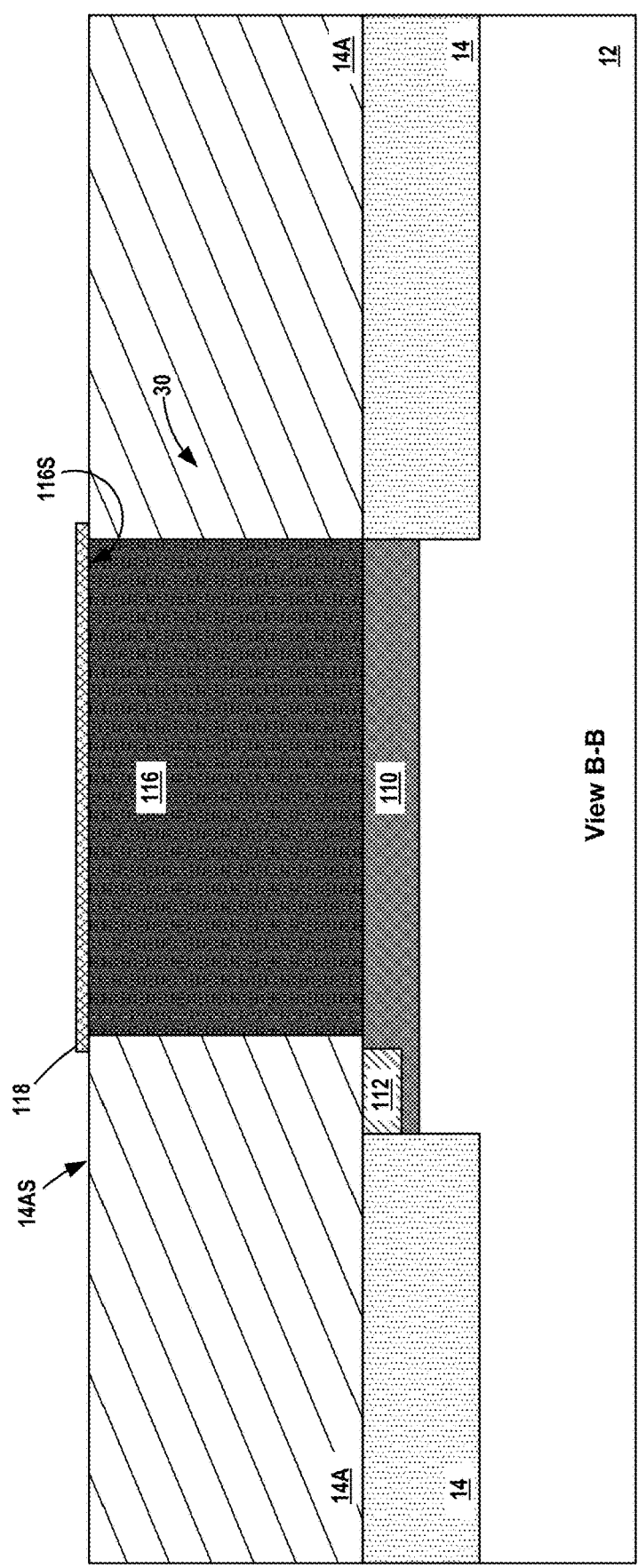

As depicted in FIGS. 4-5, an intermediate form of device 10 can include isolation structures 14, one or more active devices 50 for processing signals from photodiode arrays 11, 13, and regions 100, 110 of substrate 12 that can have modified electrical properties over which first and second photodiodes 28, 30 can be formed (see FIGS. 8 and 9). The one or more active devices 50 can be part of a processing system in electrical communication with the optofluidic sensor, such as with first photodiode 28, and responsive to a change in an electrical parameter thereof, such as a voltage or current. In embodiments, substrate 12 can be patterned (using known masking and etching techniques) and insulative material can be deposited to form various isolation structures 14 in substrate 12. For example, after substrate 12 is patterned and an etch mask is removed, an insulating material (e.g., silicon dioxide) can be deposited so as to overfill openings formed in substrate 12. Then a planarization process, such as a chemical mechanical planarization process, can be performed to remove excess amounts of the insulating material positioned outside of the openings in substrate 12 and above the upper surface of substrate 12. Active devices 50 for processing signals from photodiode arrays 11, 13 are represented by an FET, which can include source, drain, and gate regions 52, 54, 56, respectively. Source and drain regions 52, 54 can include respective silicide layers 58, 60, and gate region 56 can include a gate oxide layer 62 and conductive gate material layer 64. Processes for forming such devices and suitable materials used therein are well understood, and it should be apparent that a wide variety of devices can be formed in addition to or in place of FET 50. In addition to devices such as FET 50, first and second regions 100, 110 of modified electrical properties can be prepared for first and second photodiodes 28, 30 of respective first and second photodiode arrays 11, 13. For example, if a p-type material is used to form substrate 12, then regions 100, 110 can be n+ regions formed by well-known processes. Regions 100, 110, can further include silicide layers 102, 112, which in embodiments can be formed at the same time as silicide layers 58, 60 of FET 50 and/or other devices as might be formed.

Figure 6:
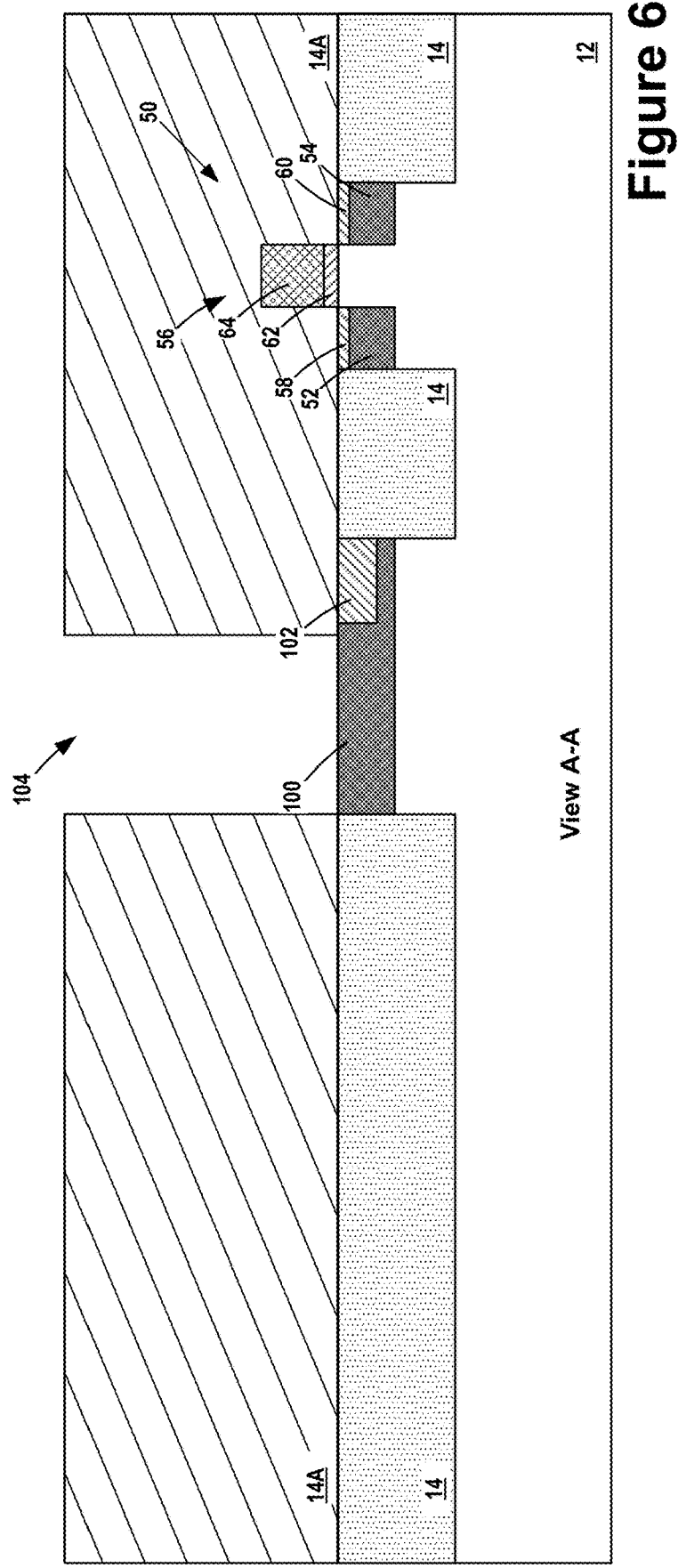
Figure 7:
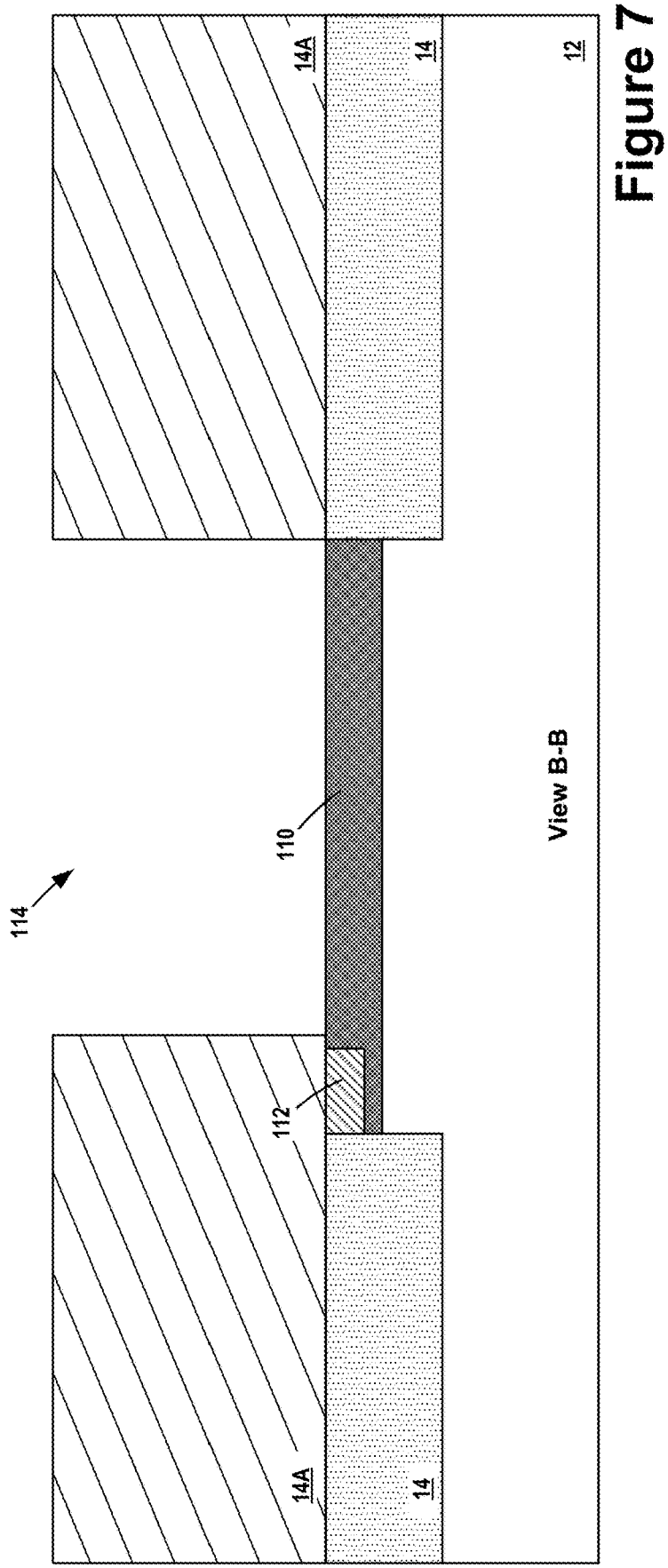

FIGS. 6 and 7 depict a further intermediate form of device 10 that can be obtained from that depicted in FIGS. 4 and 5. In embodiments, a layer of insulative material 14A, such as a dielectric material, can be deposited over the entire depicted region of device 10 shown in FIGS. 4 and 5. For example, a thick layer of a BEOL dielectric material, such as silicon dioxide, can be deposited. Thereafter, a first patterned etch mask (not shown) can be formed above first and second regions 100, 110 of device 10. Thereafter, an etching process can be performed to remove exposed portions of insulative material 14A to thereby define first and second trenches 104, 114 where respective first and second photodiodes 28, 30 will be formed (see FIGS. 8 and 9). As seen in FIGS. 6 and 7, trenches 104, 114 can extend to an upper surface of each of first and second regions 100, 110, though first trench 104 could extend into first region 100 and/or second trench 114 could extend into second region 112. In any case, bottoms of first and second trenches 104, 114 can comprise respective exposed surfaces of respective first and second regions 100, 110. In embodiments, first and second trenches 104, 114 can be patterned and formed such that respective conductive portions, such as silicide layers 102, 112, remain covered by insulative material 14A. In some embodiments, insulative material 14A can be the same material as used to form isolation structures 14, though this need not be the case.

FIGS. 8 and 9 depict a still further intermediate form of device 10 that can be obtained by performing several additional process operations on that shown in FIGS. 6 and 7. For example, multiple regions of epitaxial semiconductor material in the various regions of the device 10 can be formed by performing known epitaxial semiconductor growth processes. The regions of epitaxial semiconductor material can be formed in an undoped condition or at least some of them can be doped in situ. The regions of epitaxial semiconductor are shaded differently to facilitate explanation and such shading should not be interpreted as indicating that regions of epitaxial semiconductor material are made of different materials or that they are formed at different times in different processing steps, although that may be the case in some applications. In one illustrative process flow, all of the regions of epitaxial semiconductor material can be formed by performing a single epitaxial growth process. In other process flows, a patterned hard mask layer (not shown) can be formed on device 10 to control the region where a particular epi semiconductor material is formed and thereafter removed. The patterned hard mask layer can then be removed, and the process repeated as needed to form additional epitaxial semiconductor material in a different region of device 10.

As indicated in FIGS. 8 and 9, a first body layer of epi semiconductor material 106 for first photodiode(s) 28 can be formed in first trench 104, and a second body layer of epi semiconductor material 116 can formed in second trench 114 for second photodiode(s) 30. In embodiments, first and second body layers of epi semiconductor materials 106, 116 can be construed as forming semiconductor bodies of respective first and second photodiodes 28, 30 and can be referred to as such. Bottoms of the semiconductor bodies can be in electrical communication with and/or engaged by portions of respective ones of regions 100, 110. Either of epi materials 106, 116 can be single crystal materials if its respective region 100, 110 is a single crystal material such that the epi material can be grown on the single crystal material of the respective region 100, 110. In one illustrative embodiment, epi semiconductor material 106 for first photodiode 28 can be formed in such a manner that an upper surface 106S of the epi material 106 is substantially coplanar with an upper surface 116S of epi material 116, as well as an upper surface 14AS of insulative material 14A. Thereafter, a first conductive upper layer 108 can be formed on epi semiconductor material 106 for first photodiode(s) 28 and a second conductive upper layer 118 can be formed on epi semiconductor material 116 for second photodiode(s) 30. Conductive upper layers 108, 118 can be formed of any conductive material and they can be formed by performing known manufacturing techniques. In embodiments, one or both of conductive upper layers 108, 118 can include polycrystalline silicon, such as p+ polycrystalline silicon.

Figure 10:
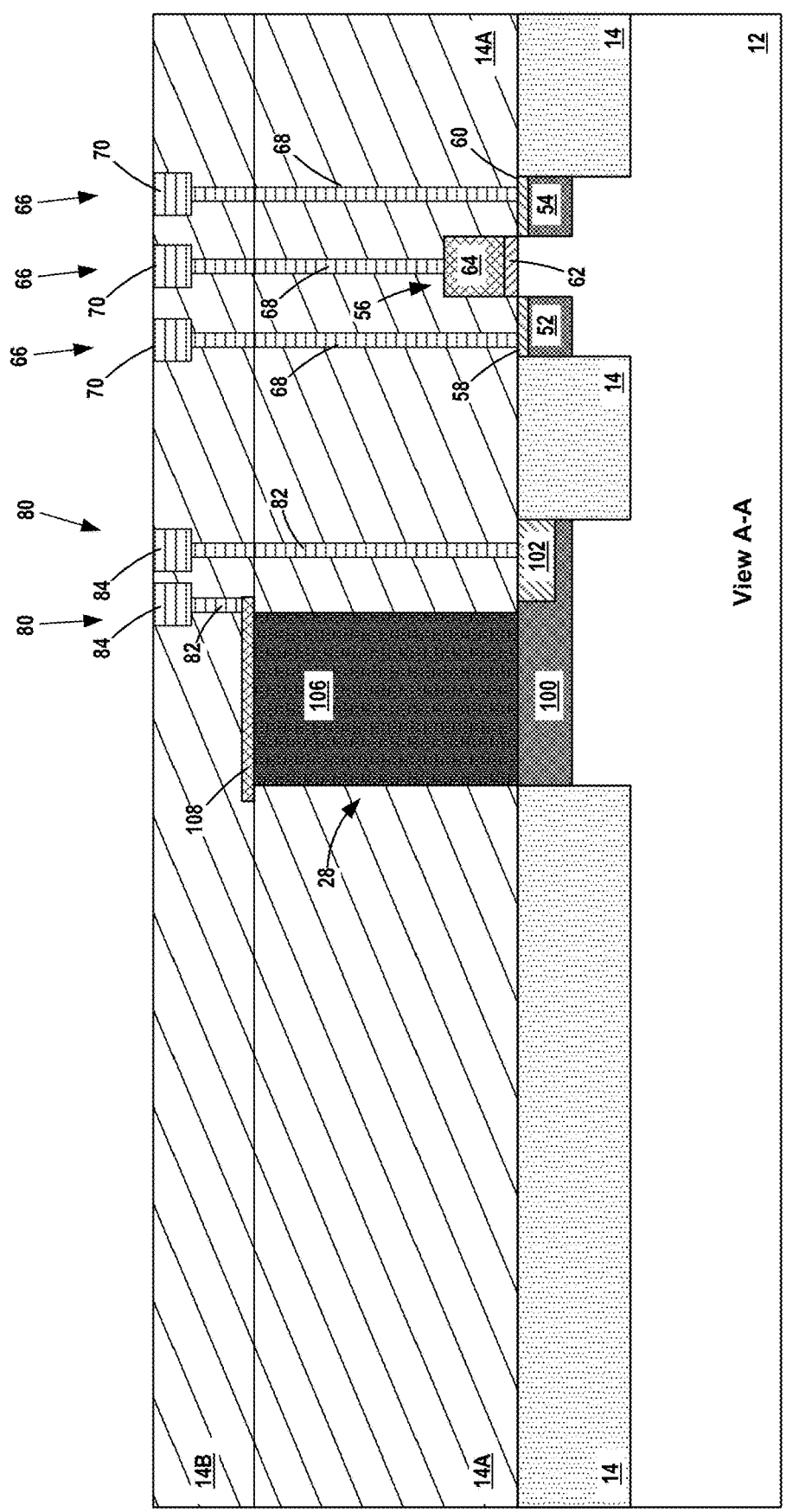
Figure 11:
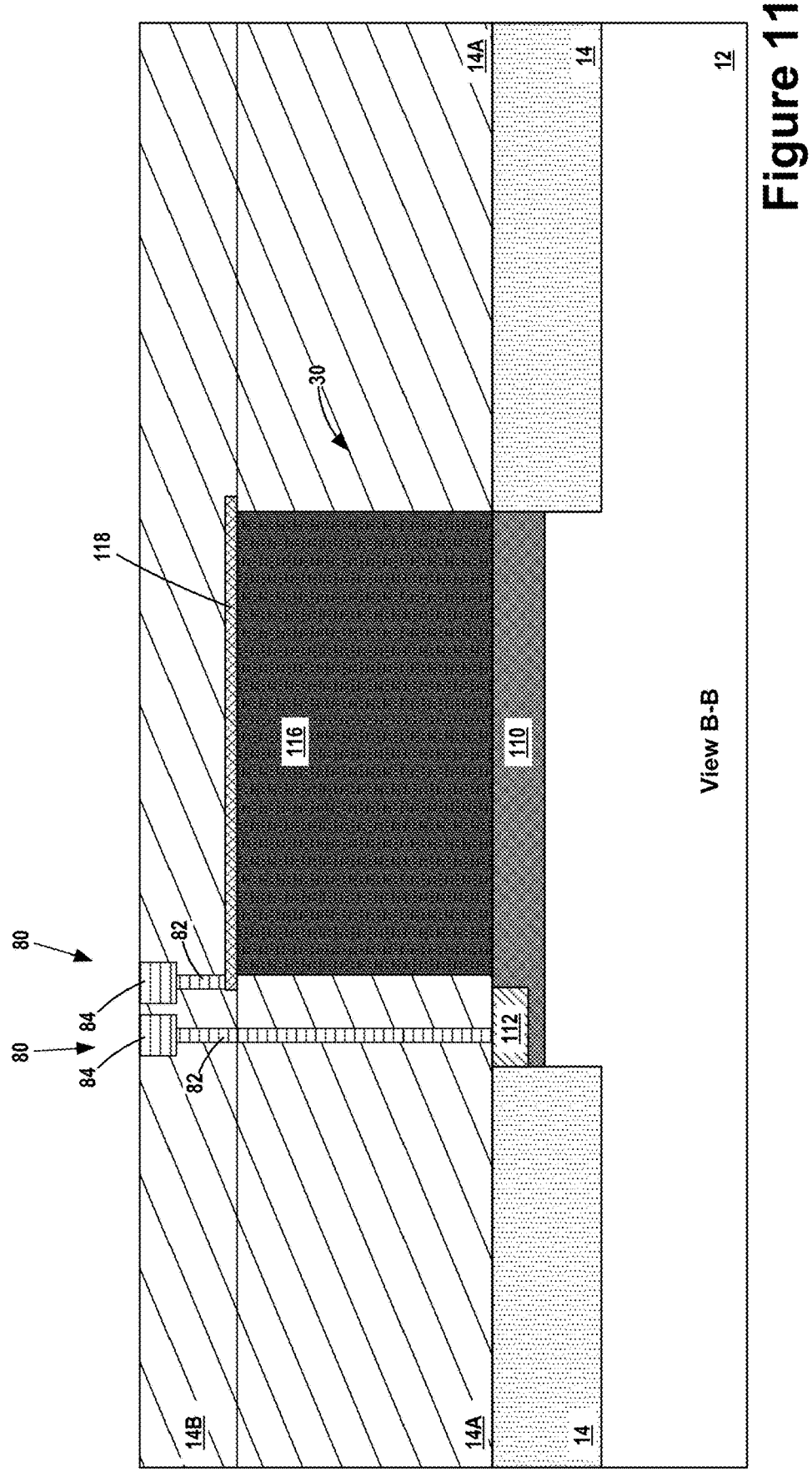

Epi semiconductor materials of first and second body layers 106 and 116 can be formed from a variety of different materials, e.g., germanium (Ge), silicon germanium (SiGe), silicon (Si), silicon-carbide (SiC), etc. The semiconductor materials of first and second body layers 106 and 116 for first and second photodiodes 28, 30 need not be made of the same epitaxial semiconductor material, but that may be the case in some applications. Though depicted as having the same vertical thickness, epi semiconductor materials of first and second body layers 106, 116 need not have the same vertical thickness, but that may be the case in some applications. In one particular example, one or both of first and second body layers 106, 116 for first and second photodiode(s) 28, 30 can include silicon-germanium, while in another, one or both of first and second body layers 106, 116 can include germanium. In an embodiment, the layer(s) of material(s) used to form first and second regions 100, 110 first and second body layers 106, 116, and first and second conduct upper layers 108, 118 can be doped to form a p-i-n diode such that first and second regions 100, 110 are n-type doped, first and second body layers 106, 116 are undoped (intrinsically doped), and first and second conductive upper layers 108, 118 are p-type doped. Other doping profiles can also be utilized depending on the performance requirements for the photodiodes. First and second regions 102, 112 can have enhanced doping to form a low resistivity contact to the metal/silicide. First and second conductive upper layers 108, 118 can have a 'ring' of silicided region along the edge for low resistance contact formation to contact paths 82 of contacts 80 (FIGS. 10, 11). It should be understood, of course, that first and second regions 100, 110 can be formed from a single layer and/or deposition of material, body layers 106, 116 can be formed from a single layer and/or deposition of material, and first and second conductive upper layers 108, 118 can be formed from a single layer and/or deposition of material by processes well understood in the art.

Turning to FIGS. 10 and 11, multiple patterning, material removal, and/or material deposition steps can be performed to form contact structures 80 to provide conductive pathways to silicide regions 102, 112 and conductive layers 108, 118. For example, additional insulative material 14B can be added and patterned, insulative material 14B can be removed to form trenches to expose surfaces of respective components or regions, and conductive material can be deposited to form contact paths 82, and additional such processes can be performed to form contact pads 84. The same or similar steps can be used to form contacts 66 for device 50, which can include contacts 68 and contact pads 70. It should be understood that as with insulative material 14A, insulative material 14B can include the same material (s) as insulative material 14 and/or insulative material 14A, but this need not be the case. In embodiments, region 100 and silicide layer 102 can be part of first conductive structure 48 (FIG. 1), and region 110 and silicide layer 112 can be part of second conductive structure 49 (FIG. 1).

Figure 12:
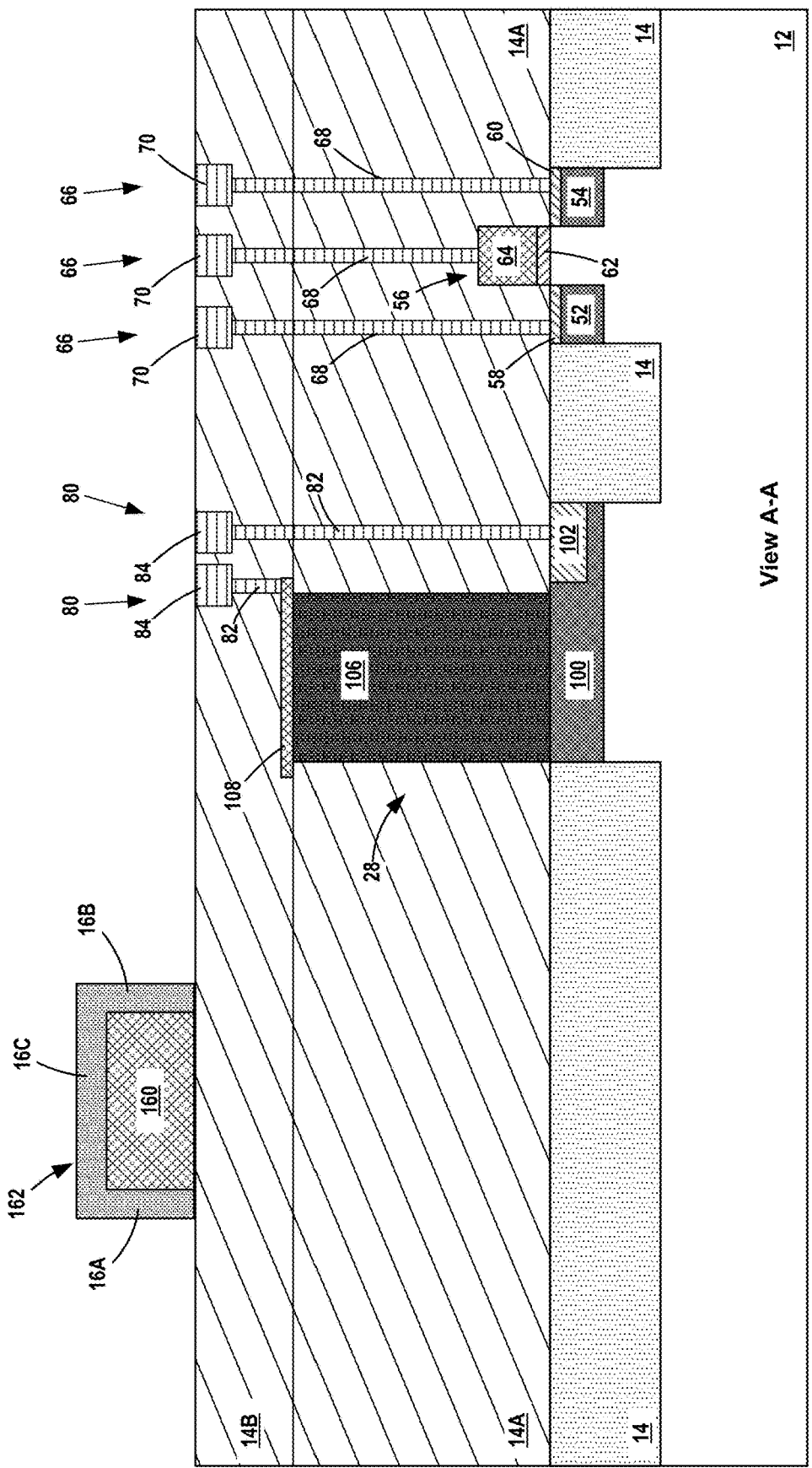
Figure 13:
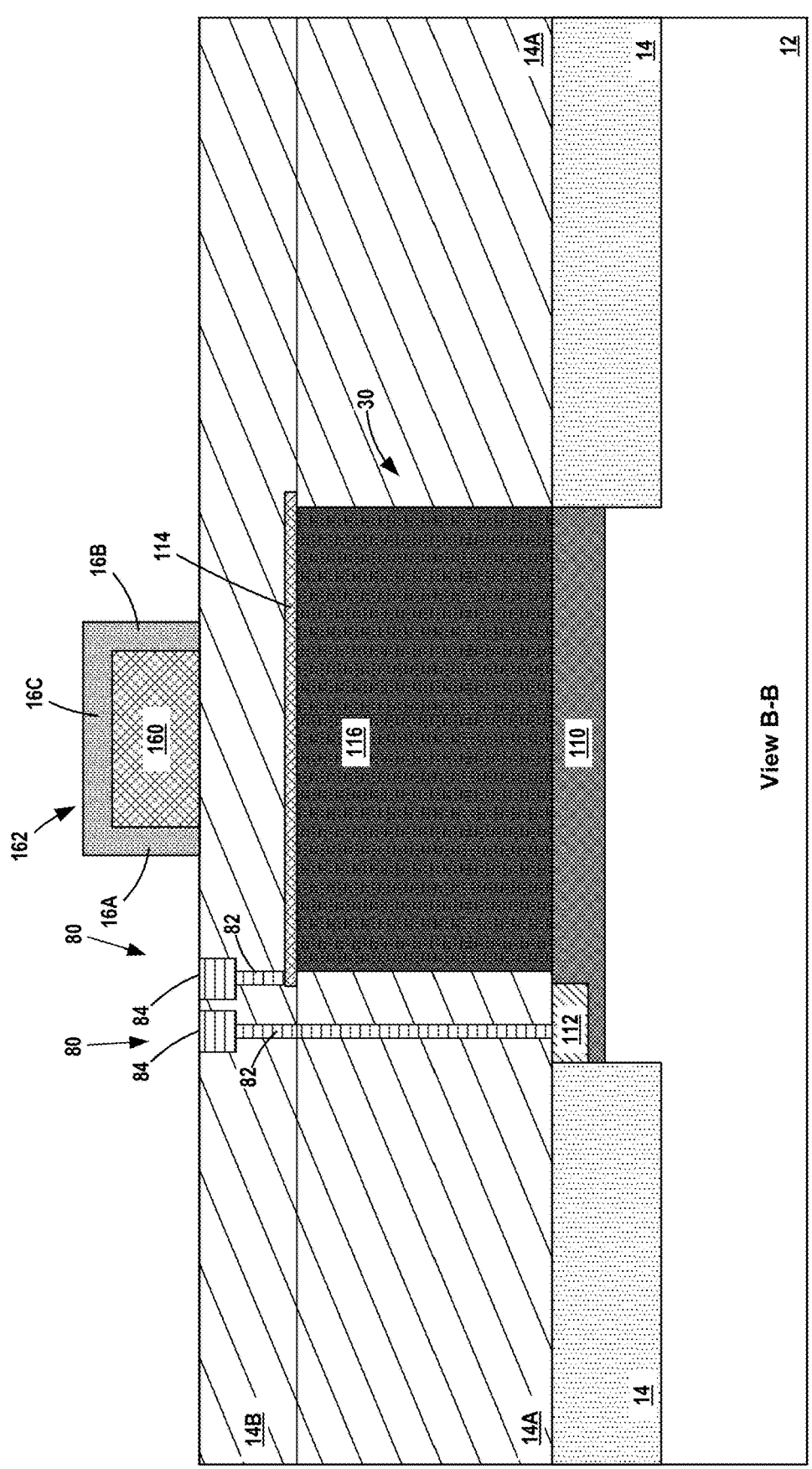
Figure 14:
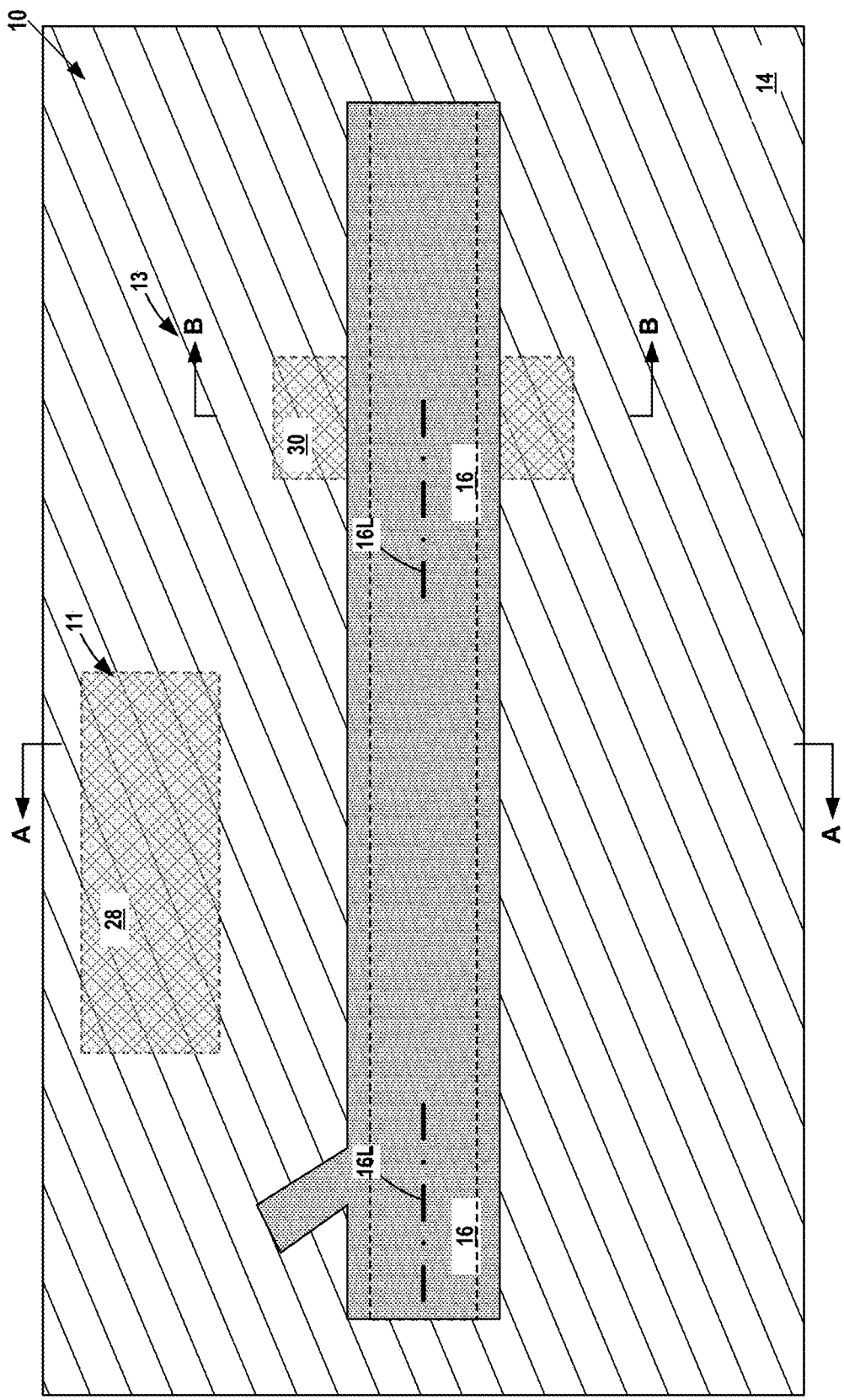
Figure 15:
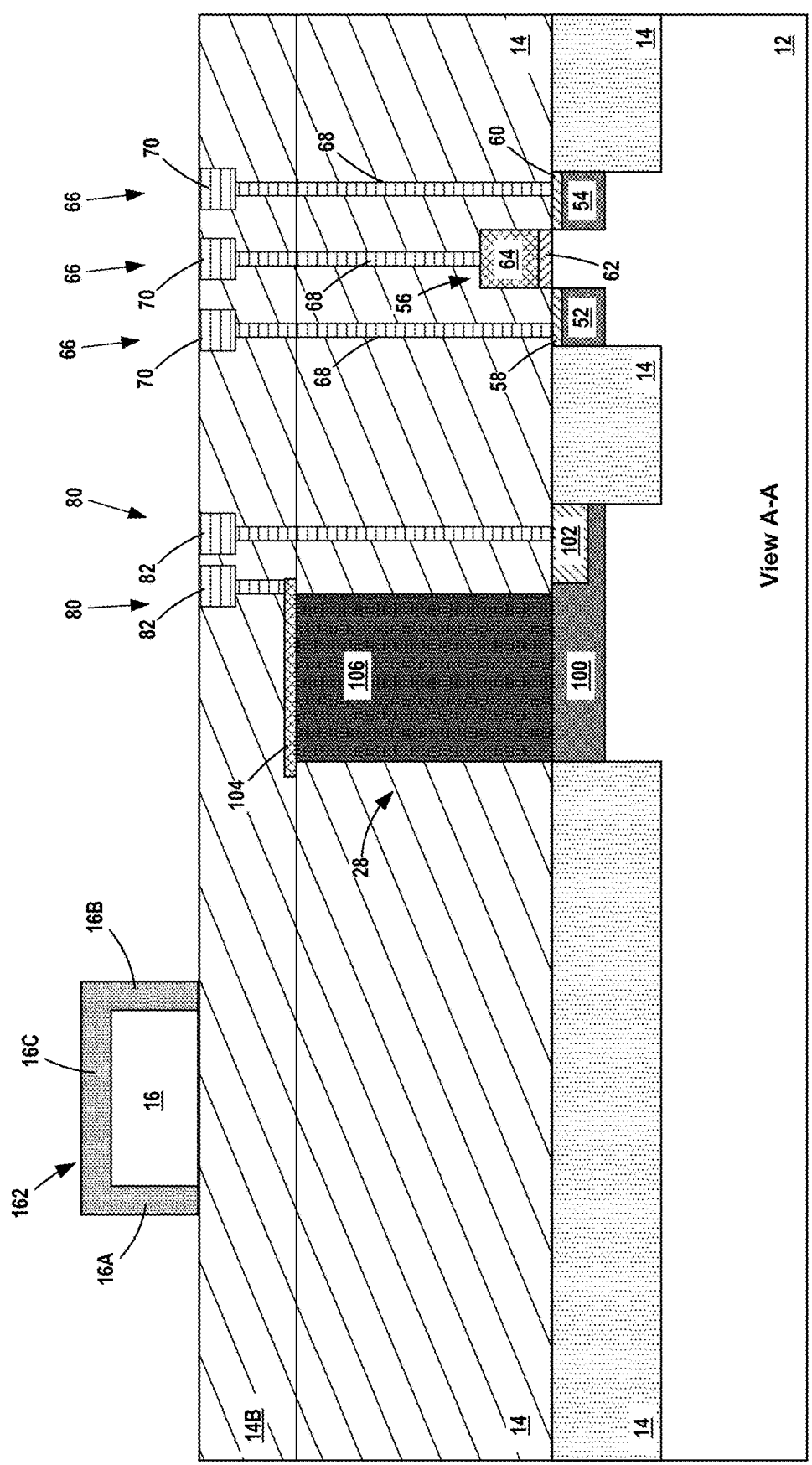
Figure 16:
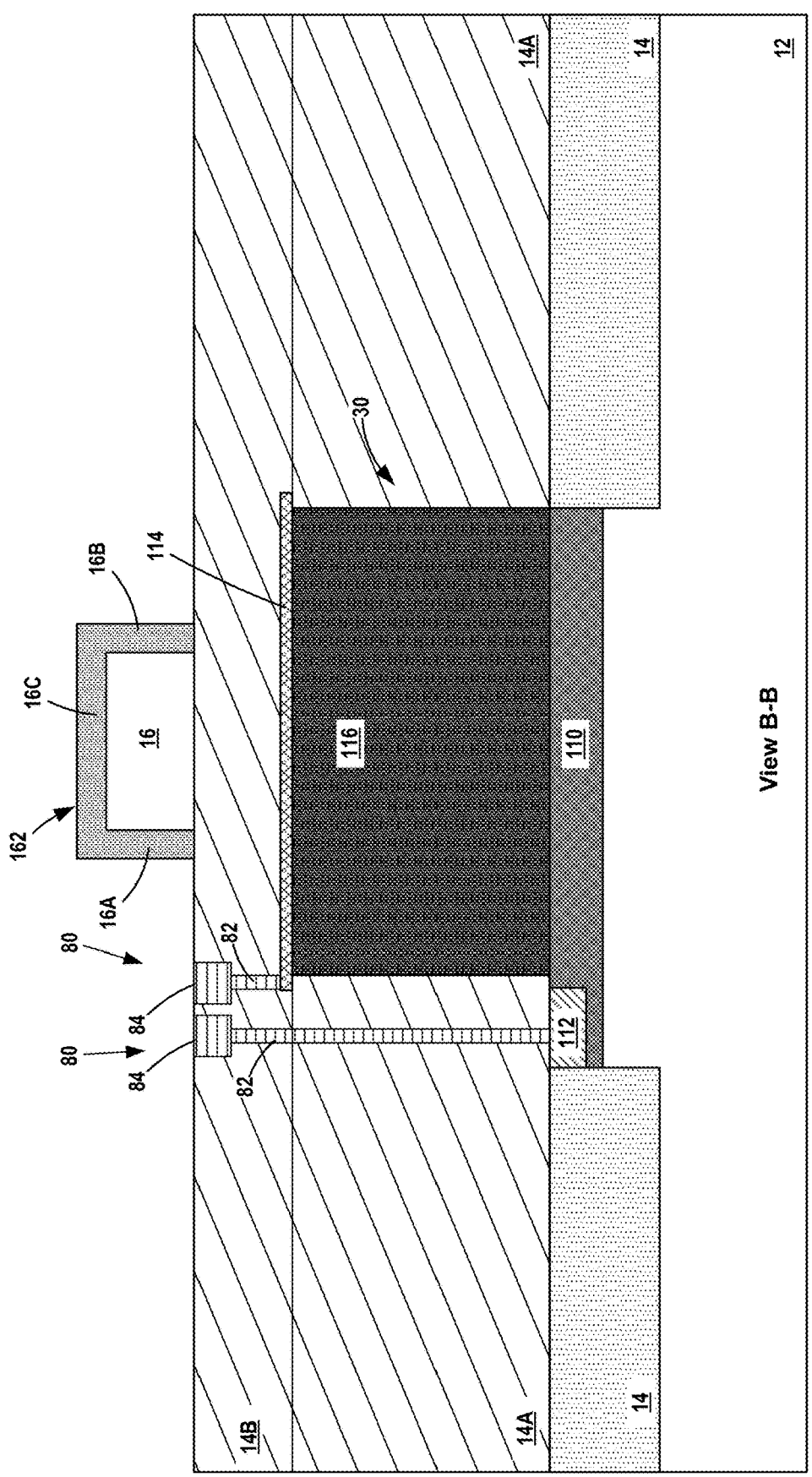

As seen in FIGS. 12 and 13, various patterning, deposition, growth, and/or removal process operations can be performed on device 10 to begin construction of channel 16 (see FIGS. 1 and 2) with formation of sacrificial channel core layer 160 and initial channel wall layer 162. For example, sacrificial channel core layer 160 can be formed by depositing additional insulative material, forming a trench for core layer 160, depositing or growing material in the trench to form core layer 160, then removing the additional insulative material. Alternatively, material for core layer 160 can be blanket deposited, patterned, and undesired material removed, leaving sacrificial channel core layer 160. Initial channel wall layer 162 can be conformally deposited over sacrificial channel core layer 160, such as by blanket depositing material and removing unwanted excess material, such as by etching. In embodiments, sacrificial channel core layer 160 can include a semiconductor material, such as polycrystalline silicon or germanium or a combination of polycrystalline silicon and germanium, though other embodiments can employ a polymer material for core layer 160. Initial channel wall layer 162 can include any suitable, selectively etched material, such as silicon nitride. Then, as seen in FIGS. 14-16, sacrificial channel core layer 160 can be removed, such as by forming holes in initial channel wall layer 162 and etching out core layer 160, leaving at least part of initial channel wall layer 160 and a cavity forming channel 16 therein.

Figure 17:
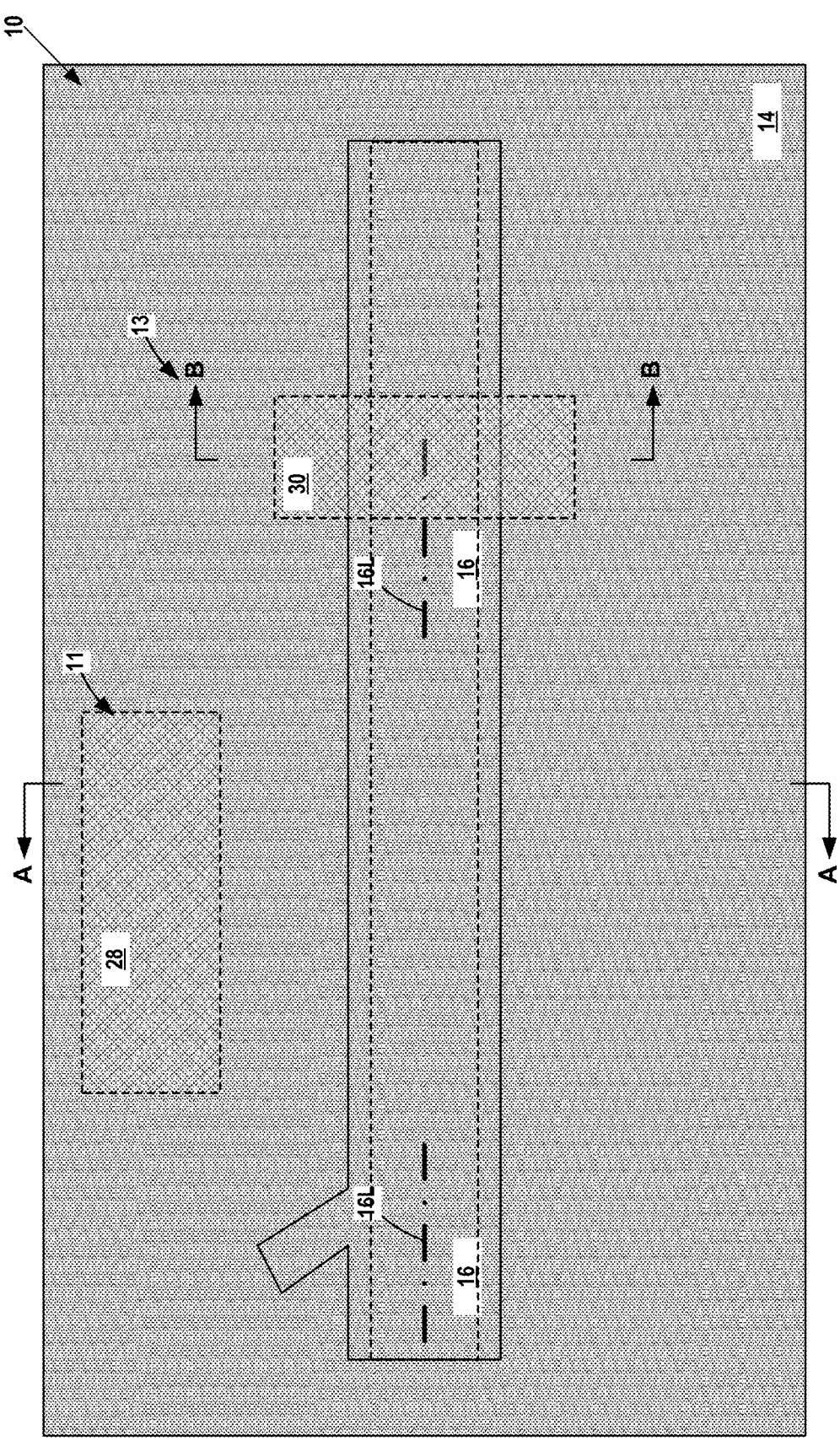
Figure 18:
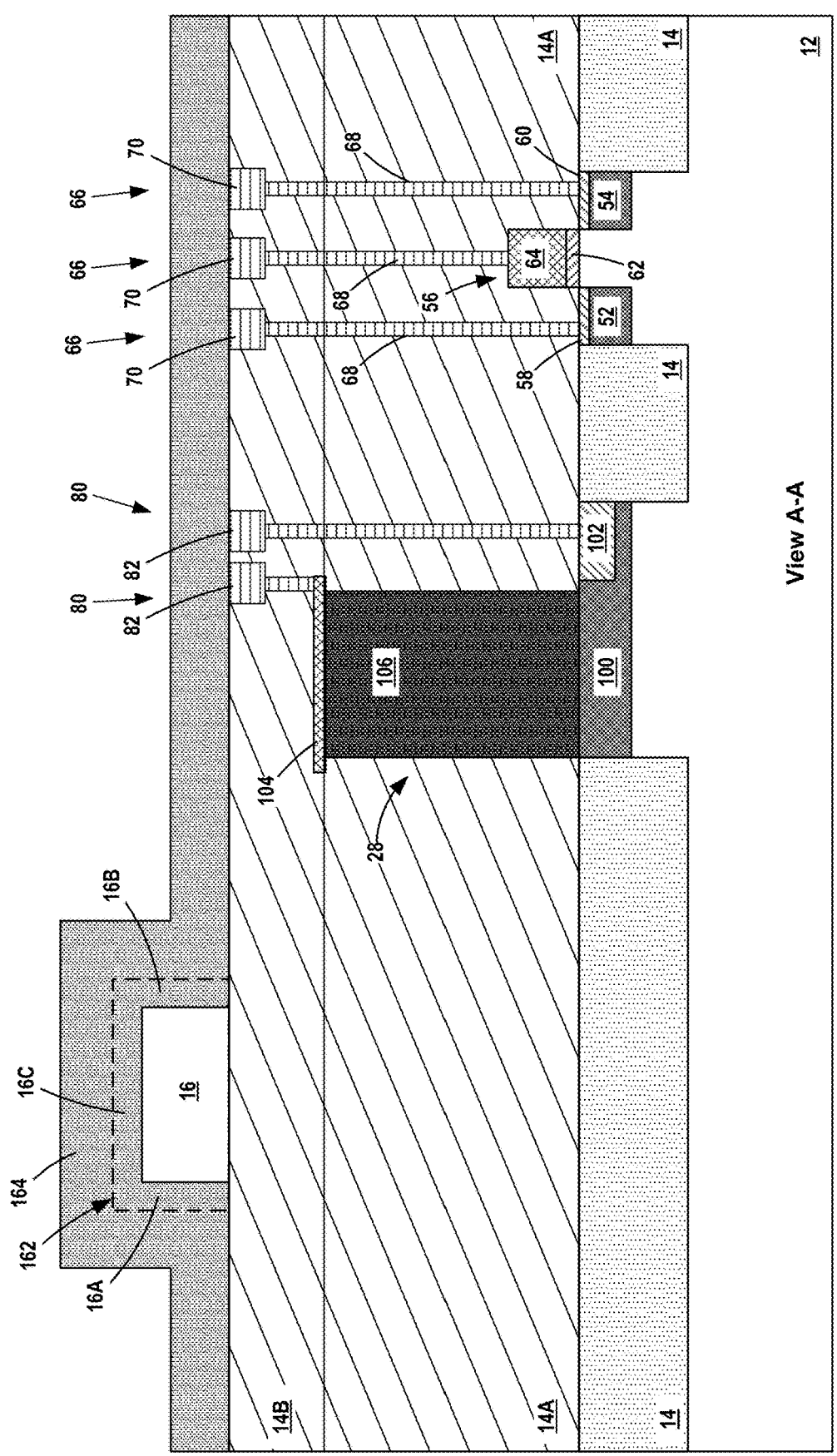
Figure 19:
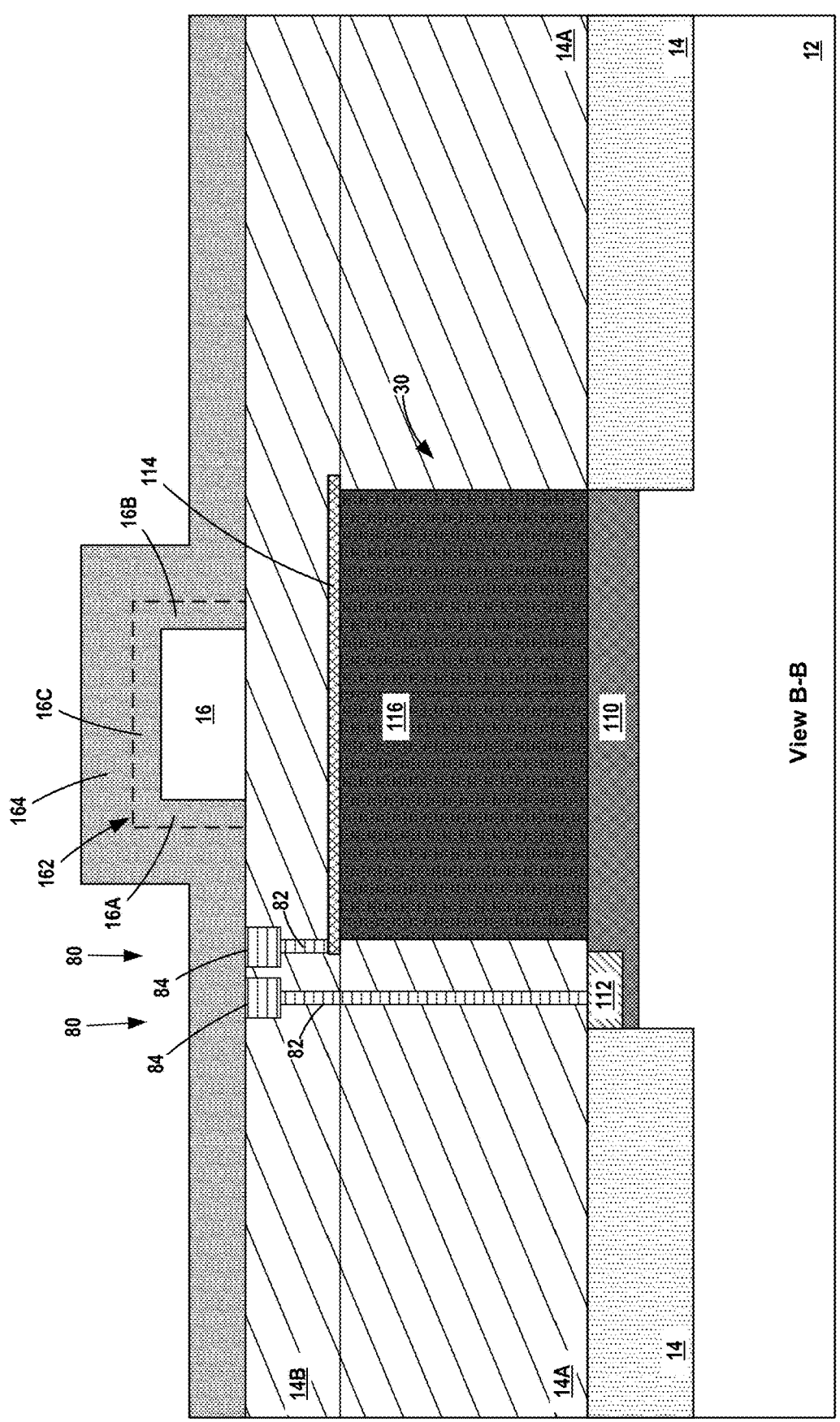
Figure 20:
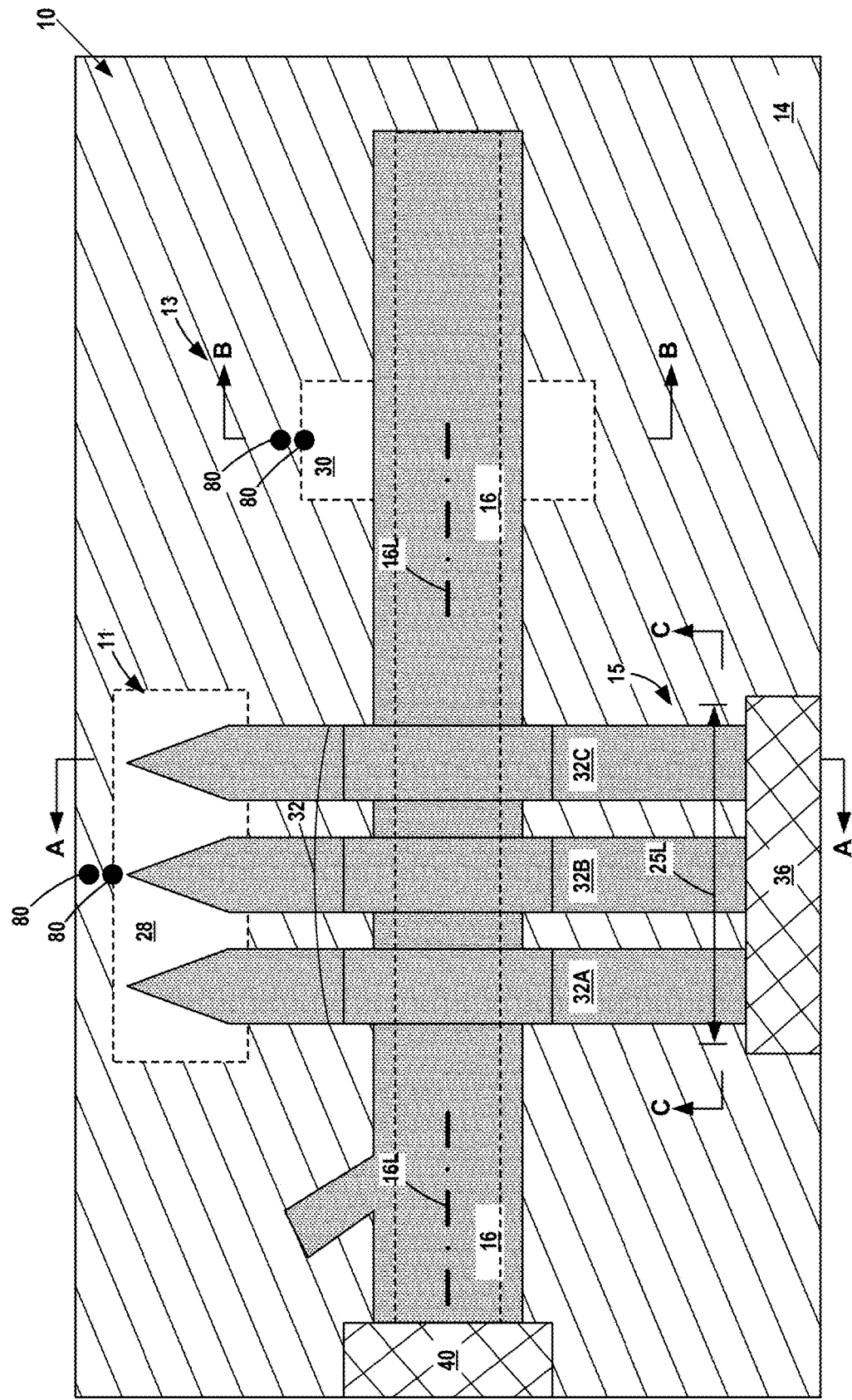
Figure 21:
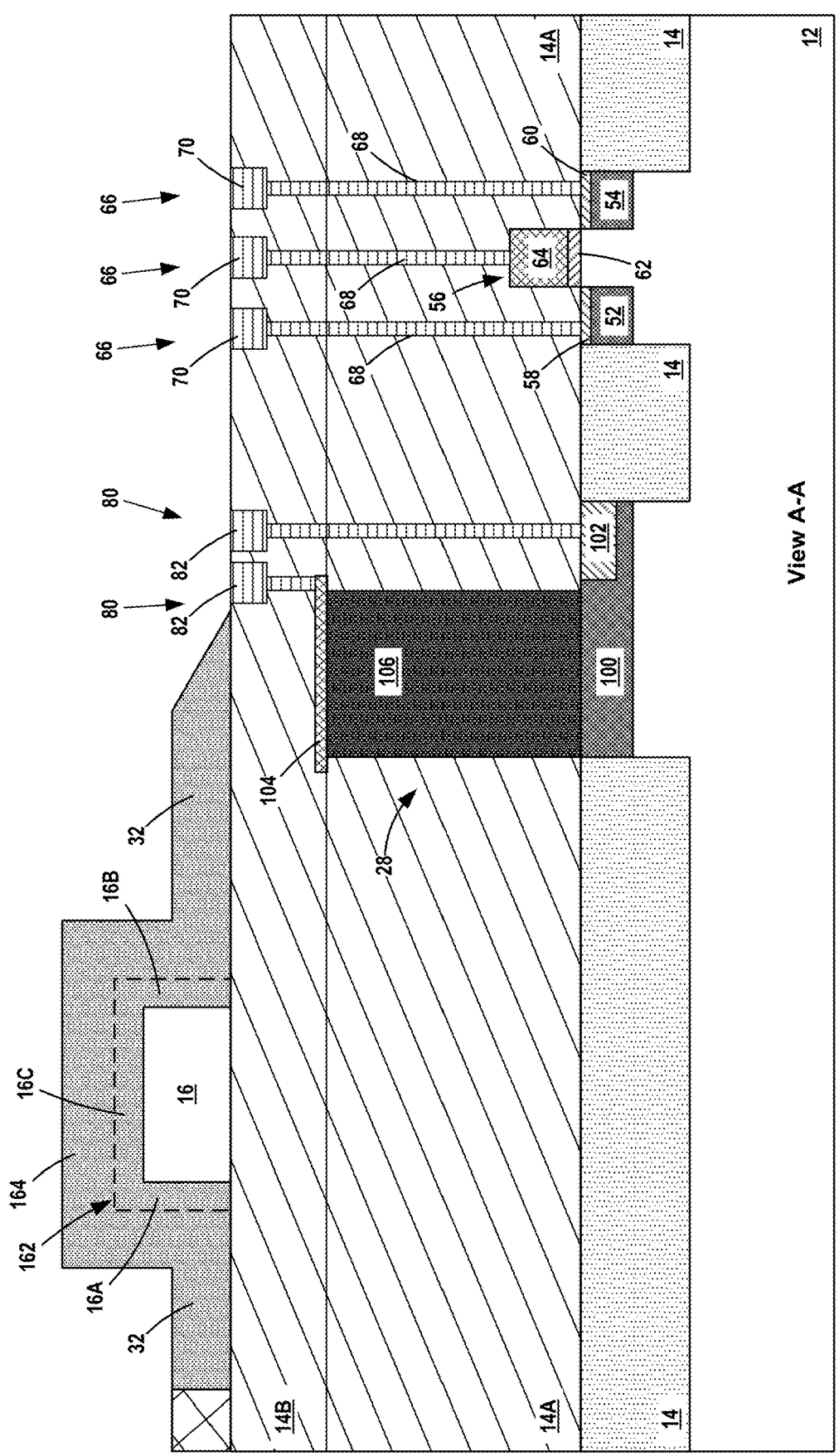
Figure 22:
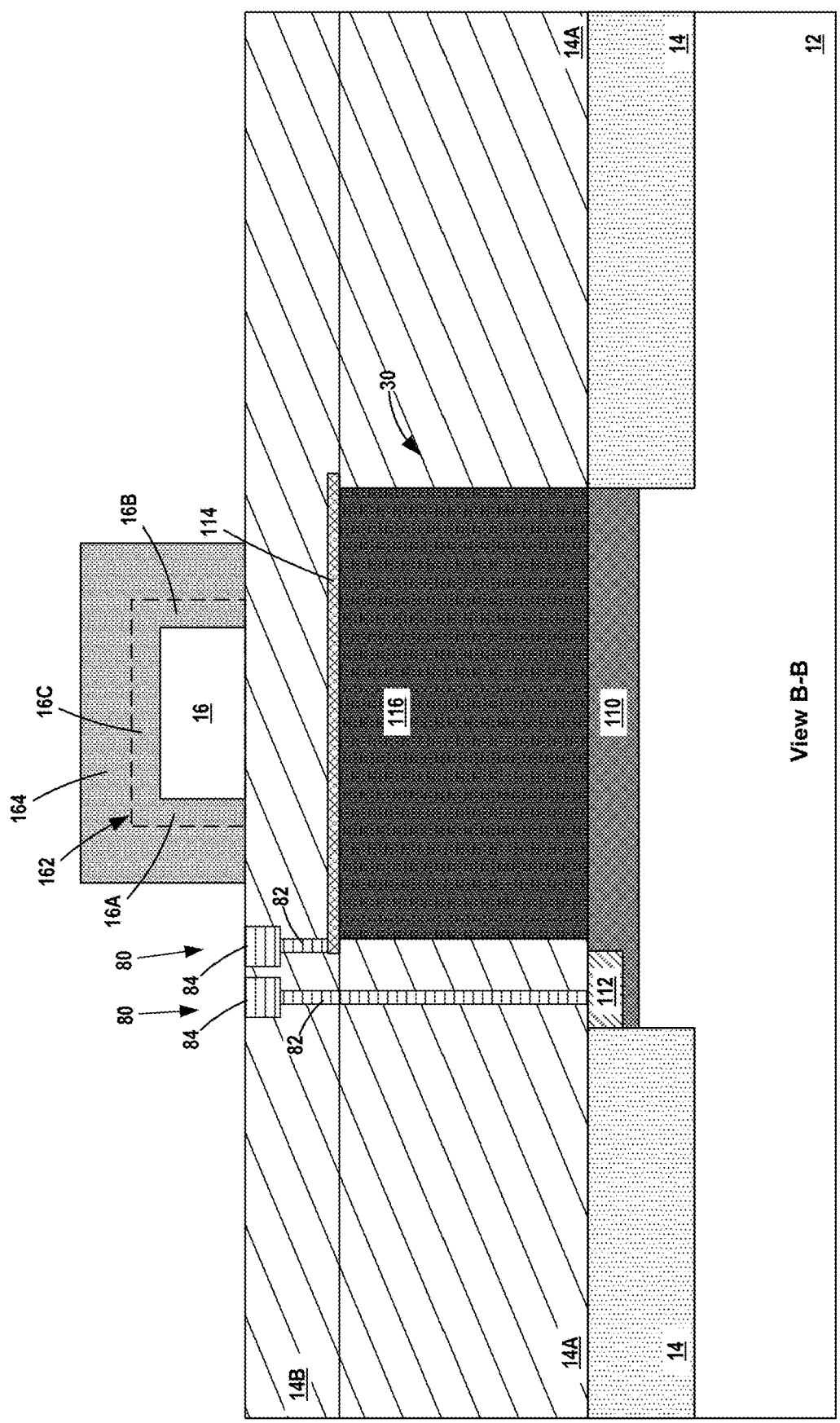

Turning now to FIGS. 17-19, deposition of an additional layer 164 of the material used to form initial channel wall layer 162 can then be performed. This additional layer can fill any holes in initial channel wall layer 162, can thicken walls 16A-C of channel 16, and can provide material from which waveguide structures 32 can be formed. Once additional layer 164 has been deposited, patterning and removal process operations can be performed to form waveguide structures 32, 32A-C, as shown in FIGS. 20-23. After formation of waveguide structures 32, 32A-C, further process operations can be performed to fabricate first and second attachment mechanisms 36, 40 (FIG. 1).

With regard to the entire description, it should be understood that where one or more layers of insulating material are described, each layer may comprise multiple layers of material and the layers of material may be made of different materials. For example, layer of insulating material 14 may comprise one or more layers of silicon dioxide and/or a low-k material with a layer of silicon nitride (which functions as an etch stop layer) positioned between the layers of silicon dioxide and/or low-k material. The structure, composition and techniques used to form such layer(s) of insulating material 14 are well known to those skilled in the art. Additionally, as noted above with regard to FIGS. 10-11, for example, various simplistically depicted conductive contacts 66, 80 are formed to contact various structures on the device. For example, FIG. 10 depicts conductive contacts 80 including contact pads 84 that are conductively coupled to silicide region 102 adjacent first photodiode 28 and to conductive cap 108 atop first photodiode 28 via conductive paths 82. Likewise, FIG. 11 depicts conductive contacts 80 including contact pads 84 that are conductively coupled to silicide region 112 adjacent second photodiode 30 (FIG. 1) and to conductive layer 118 atop second photodiode 30 (FIG. 1) via conductive paths 82. In addition, FIG. 10 depicts conductive contacts 66 including contact pads 70 that are conductively coupled to source and drain silicide layers 58, 60 and to conductive gate material layer 64 via conductive paths 68. The simplistically depicted conductive contacts 80 may come in a variety of forms and configurations, they may be comprised of a variety of different conductive materials and they may be manufactured by performing known manufacturing techniques.

Various operational aspects to illustrative and device 10 will now be described. For example, first radiation source 34 can be adapted to irradiate samples in fluid 22 by generating first radiation 44 that can be directed in a direction that is substantially normal to a direction of the flow of samples in the fluid in channel 16 and more specifically in the region crossed by waveguide structures 32 so as to cause what can be referred to as orthogonal fluorescence of irradiated samples in fluid 22. In addition, second radiation source 38 can be adapted to irradiate samples in fluid 22 by generating second radiation 42 that can be directed in a direction that can be substantially parallel to the direction of flow of fluid 22 in channel 16 so as to cause what can be referred to as fluorescence due to laser excitation parallel to the flow of irradiated samples in fluid 22. In turn, first photodiode 28 can be adapted for sensing orthogonal fluorescence of samples in fluid 22 flowing through channel 16, while second photodiode 30 can be adapted to sense parallel fluorescence of samples in fluid 22 flowing through channel 16. By providing fluorescence excited in orthogonal directions in a two-dimensional plane, the identification of the target samples can be better correlated to the multi-dimensional shape of fluorescing samples, e.g., DNA, virus, protein, etc.

As will be appreciated by those skilled in the art after a complete reading of the present application, device 10 disclosed herein includes several configurations. In no particular order of importance, device 10 includes an optofluidic fluidic sensor incorporated with or integrated with at least one photodetector (28 or 30), all of which can be formed on or above a single semiconductor substrate 12. In one particular embodiment, first diode 28 and/or second photodiode 30 can be formed beneath a surface on which channel 16 is formed, which can allow more efficient radiation transfer, such as via evanescent coupling or adiabatic coupling. In embodiments, a distance between a top of first photodiode 28 and bottoms of waveguide structures 32 is no more than about 2 µm, and preferably less than about 0.5 µm, to ensure evanescent/adiabatic coupling can occur when first photodiode 28 includes germanium.

Likewise, in embodiments a distance between a top of second photodiode 30 and a bottom of channel 16 is no more than about 2 µm, and preferably less than about 0.5 µm, to ensure evanescent/adiabatic coupling can occur when second photodiode 30 includes germanium. Additionally, in embodiments waveguide structures 32, used to convey first radiation 42, can be made from the same material(s) as walls of channel 16. Such use of the same material(s) can reduce losses as first radiation passes from first radiation source 34 to first photodiode 28.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the disclosure. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
 a substrate;
 a channel formed on and at least partially defined by at least a portion of an upper surface of a layer of a first material formed on the substrate, walls of the channel being formed from a second material that includes a dielectric material, the channel being adapted to receive a fluid therein;
 an input fluid reservoir;
 an output fluid reservoir, wherein the channel is in fluid communication with the input fluid reservoir and the output fluid reservoir;
 a first radiation source operatively coupled to the substrate, wherein the first radiation source is adapted to generate radiation in a first direction toward the channel; and
 at least one first photodiode positioned below the channel, wherein each of the at least one first photodiode includes a semiconductor body with an upper surface in the layer of first material, and a region of modified substrate under each semiconductor body of the at least one first photodiode.

2. The device of claim 1, wherein a top of the at least one first photodiode is positioned less than 2 µm below a bottom of the at least one waveguide structure.

3. The device of claim 2, wherein the top of the at least one first photodiode is positioned no more than 0.5 µm below a bottom of the at least one waveguide structure.

4. The device of claim 1, wherein the first direction is substantially normal to a long axis of the channel, the at least one first photodiode is also adjacent the channel, and the device further comprises at least one waveguide structure formed from the second material, the at least one waveguide structure being arranged to convey radiation from the first radiation source to the channel and from the channel to the at least one first photodiode.

5. The device of claim 4, wherein the at least one first photodiode includes a semiconductor material and the second material includes a dielectric material.

6. The device of claim 5, wherein the at least one first photodiode includes germanium and the second material includes silicon nitride.

7. The device of claim 4, wherein the first radiation source is positioned adjacent a first side of the channel, the at least one first photodiode is positioned adjacent a second side of the channel that is opposite to the first side of the channel and the at least one waveguide structure extends from the first radiation source to the first side of the channel, and from the second side of the channel to the at least one first photodiode.

8. The device of claim 7, wherein the at least one waveguide structure also extends from the first side of the channel to the second side of the channel over a top of the channel.

9. The device of claim 4, further comprising a second radiation source, wherein the first radiation source is adapted to generate radiation in a direction that is substantially normal to a long axis of the channel and wherein the second radiation source is adapted to generate radiation in a direction that is substantially parallel to the long axis of said channel, the channel being sized and shaped to act as a second waveguide structure in addition to conveying fluid from the input reservoir to the output reservoir.

10. The device of claim 9, wherein the at least one first photodiode is also adjacent the second side of the channel and the device further comprises at least one second photodiode positioned below and optically coupled to the channel, the at least one second photodiode being spaced apart from the at least one first photodiode in a direction parallel to the long axis of the channel.

11. The device of claim 1, wherein the substrate is a bulk semiconductor substrate, and wherein the device further comprises:
 a shallow trench isolation in the substrate under the layer of first insulative material and around each region of modified substrate;
 a first contact structure electrically coupled to each semiconductor body of the at least one first photodiode and to a respective first contact pad; and
 a second contact structure electrically coupled to each region of modified substrate of the at least one first photodiode and to a respective second contact pad.

12. The device of claim 1, further comprising at least one component formed on the substrate in electrical communication with the at least one first photodiode and configured to send an alert in response to a change in an electrical parameter of the at least one first photodiode.

13. The device of claim 12, wherein the at least one component includes a field effect transistor (FET) formed in the substrate and the layer of first material, the shallow trench isolation also being formed around the FET.

14. A device, comprising:
a substrate;
a channel adapted to receive a fluid therein, the channel being at least partially defined by at least an upper surface of a layer of first material formed on the substrate, the channel having a long axis and first and second opposing sides, wherein side walls and an upper wall of the channel are formed from a second material that includes a dielectric material;
an input fluid reservoir;
an output fluid reservoir, wherein the channel is in fluid communication with and is arranged to convey fluid from the input fluid reservoir to the output fluid reservoir;
a first radiation source operatively coupled to the substrate, wherein the first radiation source is adapted to generate radiation in a direction that is substantially normal to the long axis of the channel;
at least one first waveguide structure formed from the second material and extending from the first radiation source to the first side of the channel, wherein the at least one first waveguide structure is adapted to transmit radiation from the first radiation source to the first side of the channel;
at least one first photodiode positioned vertically below the second side of the channel, the at least one first waveguide structure further extending over a top of the channel and from the second side of the channel to over the at least one first photodiode;
a transverse exposure portion of the channel at least partially defined by an extent of the at least one first waveguide structure along the long axis of the channel and in which, during operation, radiation from the first radiation source passes from the first side of the channel, through the channel, and out the second side of the channel;
at least one second photodiode positioned vertically below the channel and away from the at least one first photodiode along the long axis of the channel; and
a second radiation source operatively coupled to the substrate, wherein the second radiation source is adapted to generate radiation in a direction that is substantially parallel to the long axis of the channel, the walls of the channel acting as a second waveguide structure.

15. The device of claim 14,
wherein the at least one second photodiode is positioned no more than 2 µm below the channel and at least 2 µm away from the at least one first photodiode along the long axis of the channel.

16. The device of claim 15, wherein the at least one first waveguide structure enables transmission of radiation from the first radiation source to the first side of the channel, through the channel in the transverse exposure section, and from the second side of the channel to the at least one first photodiode.

17. The device of claim 14, further comprising at least one component formed on the substrate in electrical communication with the at least one first photodiode and configured to send an alert in response to a change in an electrical parameter of the at least one first photodiode.

18. A device, comprising:
an optofluidic sensor system including:
a substrate having an input fluid reservoir and an output fluid reservoir defined therein;
a channel on an upper surface of the substrate and in fluid communication with the input fluid reservoir and the output fluid reservoir, wherein the channel includes a first side wall, a second, opposing side wall and an upper wall each including a dielectric material;
a first radiation source operatively coupled to the substrate to direct radiation normally through the channel;
a first waveguide including the dielectric material and extending from the first radiation source to a first side of the channel, up the first side wall of the channel, along the upper wall of the channel, down the second, opposing side wall, and away from the channel to an end of the first waveguide;
at least one first photodiode in the substrate positioned below the channel and under the end of the first waveguide to receive the radiation after the radiation passes normally through the channel;
a second radiation source in communication with the channel to emit radiation along a long axis of the channel;
at least one second photodiode under the channel to receive the radiation after the radiation passes longitudinally through the channel; and
a processing system formed on the substrate and in electrical communication with the optofluidic sensor system and including at least one component in electrical communication with the at least one first photodiode and the at least one second photodiode and that is responsive to a change in an electrical parameter of at least one of the photodiodes.

* * * * *